(12) United States Patent
Jeong et al.

(10) Patent No.: US 12,191,288 B2
(45) Date of Patent: Jan. 7, 2025

(54) INTEGRATED VOLTAGE REGULATOR (IVR) PACKAGE INCLUDING INDUCTOR AND CAPACITOR AND IVR SYSTEM PACKAGE INCLUDING THE IVR PACKAGE

(71) Applicant: Samsung Electronics Co., Ltd., Suwon-si (KR)

(72) Inventors: Sangnam Jeong, Hwaseong-si (KR); Yunhee Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 217 days.

(21) Appl. No.: 17/947,113

(22) Filed: Sep. 17, 2022

(65) Prior Publication Data
US 2023/0253381 A1 Aug. 10, 2023

(30) Foreign Application Priority Data
Feb. 9, 2022 (KR) .................. 10-2022-0016975

(51) Int. Cl.
 *H01L 25/16* (2023.01)
 *H01L 23/498* (2006.01)
 (Continued)

(52) U.S. Cl.
 CPC ........ *H01L 25/16* (2013.01); *H01L 23/49833* (2013.01); *H01L 25/162* (2013.01); *H01L 24/16* (2013.01); *H01L 24/17* (2013.01); *H01L 24/32* (2013.01); *H01L 24/48* (2013.01); *H01L 24/73* (2013.01); *H01L 25/0657* (2013.01); *H01L 2224/16145* (2013.01); *H01L 2224/16146* (2013.01); *H01L 2224/16225* (2013.01); *H01L 2224/1703* (2013.01); *H01L 2224/17181* (2013.01); *H01L 2224/32145* (2013.01); *H01L 2224/32225* (2013.01); *H01L 2224/48105* (2013.01); *H01L 2224/48227* (2013.01); *H01L 2224/73204* (2013.01);
 (Continued)

(58) Field of Classification Search
 CPC . H01L 25/16; H01L 23/49833; H01L 25/162; H01L 24/16
 USPC ......................................................... 361/782
 See application file for complete search history.

(56) References Cited

U.S. PATENT DOCUMENTS 8,692,368 B2 4/2014 Pan et al.
9,935,076 B1 4/2018 Ramachandran et al.
(Continued)

FOREIGN PATENT DOCUMENTS

CN 112913014 A 6/2021

*Primary Examiner* — Binh B Tran
(74) *Attorney, Agent, or Firm* — Muir Patent Law, PLLC

(57) ABSTRACT

Provided are an integrated voltage regulator (IVR) package with a minimized size including one or more inductors and one or more capacitors together with an IVR chip and improving characteristics of a voltage regulator (VR), and an IVR system package including the IVR package. The IVR package includes a package substrate, a stacked structure mounted on the package substrate and having a stack structure in which a passive device chip including one or more capacitors and an IVR chip including a voltage regulator are stacked, and an intermediate substrate disposed on the package substrate in a structure surrounding the stacked structure, the intermediate substrate including vias therein. The one or more inductors are included in the stacked structure or the intermediate substrate.

20 Claims, 19 Drawing Sheets

(51) Int. Cl.
*H01L 23/00* (2006.01)
*H01L 25/065* (2023.01)

(52) U.S. Cl.
CPC ............... *H01L 2224/73215* (2013.01); *H01L 2224/73265* (2013.01); *H01L 2225/0651* (2013.01); *H01L 2225/06513* (2013.01); *H01L 2225/06517* (2013.01); *H01L 2225/06541* (2013.01); *H01L 2225/06562* (2013.01); *H01L 2225/06565* (2013.01)

(56) References Cited

U.S. PATENT DOCUMENTS

| | | |
|---|---|---|
| 10,037,938 B2 | 7/2018 | Kim et al. |
| 11,075,175 B2 | 7/2021 | Cha et al. |
| 2020/0075553 A1 | 3/2020 | Delacruz et al. |
| 2020/0203279 A1 | 6/2020 | Ha et al. |
| 2020/0402934 A1 | 12/2020 | Kim et al. |
| 2021/0234526 A1 | 7/2021 | Kim et al. |
| 2021/0272906 A1 | 9/2021 | Kim et al. |
| 2021/0366854 A1* | 11/2021 | Yu .................. H01L 23/481 |
| 2022/0148975 A1* | 5/2022 | Chen ................ H01L 25/03 |

* cited by examiner

INTEGRATED VOLTAGE REGULATOR (IVR) PACKAGE INCLUDING INDUCTOR AND CAPACITOR AND IVR SYSTEM PACKAGE INCLUDING THE IVR PACKAGE

CROSS-REFERENCE TO RELATED APPLICATION(S)

This application claims priority under 35 U.S.C. § 119 to Korean Patent Application No. 10-2022-0016975, filed on Feb. 9, 2022, in the Korean Intellectual Property Office, the disclosure of which is incorporated by reference herein in its entirety.

BACKGROUND

The inventive concept relates to a semiconductor package, and more particularly, to a semiconductor package including an integrated voltage regulator (IVR) chip.

Voltage regulators are widely used to regulate voltages in electronic devices, such as computers, servers, and smartphones. In other electronic devices or even similar electronic devices, requirements such as a regulated voltage level and a current draw may be variously changed. Typically, specific VRs are designed for small systems based on a required input current of corresponding systems. However, because it is difficult or expensive to fabricate such a voltage regulator in a semiconductor chip, voltage regulators are generally fabricated separately and arranged on circuit boards. In addition, an inductor and a capacitor are needed for operating a voltage regulator, and the inductor and the capacitor are also arranged on a circuit board and used. Accordingly, it is desired to minimize a size of an electronic device including a voltage regulator, an inductor and a capacitor arranged on a circuit board.

SUMMARY

The inventive concept provides an integrated voltage regulator (IVR) package with a minimized size including one or more inductors and one or more capacitors together with an IVR chip and improving characteristics of a VR and an IVR system package including the IVR package.

In addition, the technical goals to be achieved by the inventive concept are not limited to the technical goals mentioned above, and other technical goals may be clearly understood by one of ordinary skill in the art from the following descriptions.

According to an aspect of the inventive concept, there is provided an IVR package including a package substrate; a stacked structure mounted on the package substrate and having a stacking structure in which a passive device chip including one or more capacitors and an IVR chip including a voltage regulator are stacked; and an intermediate substrate disposed on the package substrate in a structure surrounding the stacked structure, the intermediate substrate including vias therein. One or more inductors are included in the stacked structure or the intermediate substrate.

According to another aspect of the inventive concept, there is provided an IVR system package including an IVR package and a memory package including a memory chip and stacked on the IVR package. The IVR package includes a lower package substrate; a stacked structure mounted on the lower package substrate and having a stacking structure in which a passive device chip including one or more capacitors and an IVR chip including a voltage regulator are stacked; and an intermediate substrate disposed on the lower package substrate in a structure surrounding the stacked structure, and including vias therein. One or more inductors are included in the stacked structure or the intermediate substrate.

According to another aspect of the inventive concept, there is provided a 3-dimensional (3D) package having a package on package (POP) structure. The 3D package includes a lower package substrate; a passive device chip mounted on the lower package substrate and including one or more capacitors; a lower chip mounted on the lower package substrate and disposed adjacent to the passive device chip; an IVR chip disposed over the passive device chip and the lower chip in common, and including a voltage regulator; an intermediate substrate disposed on the lower package substrate in a structure surrounding the passive device chip, the lower chip, and the IVR chip, the intermediate substrate including vias therein; an inner sealing material configured to fill a space between the passive device chip, the lower chip, and the IVR chip and the intermediate substrate and sealing the passive device chip, the lower chip, and the IVR chip; and a memory package mounted on the intermediate substrate, and including a memory chip. One or more inductors are arranged in the intermediate substrate by using the vias.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
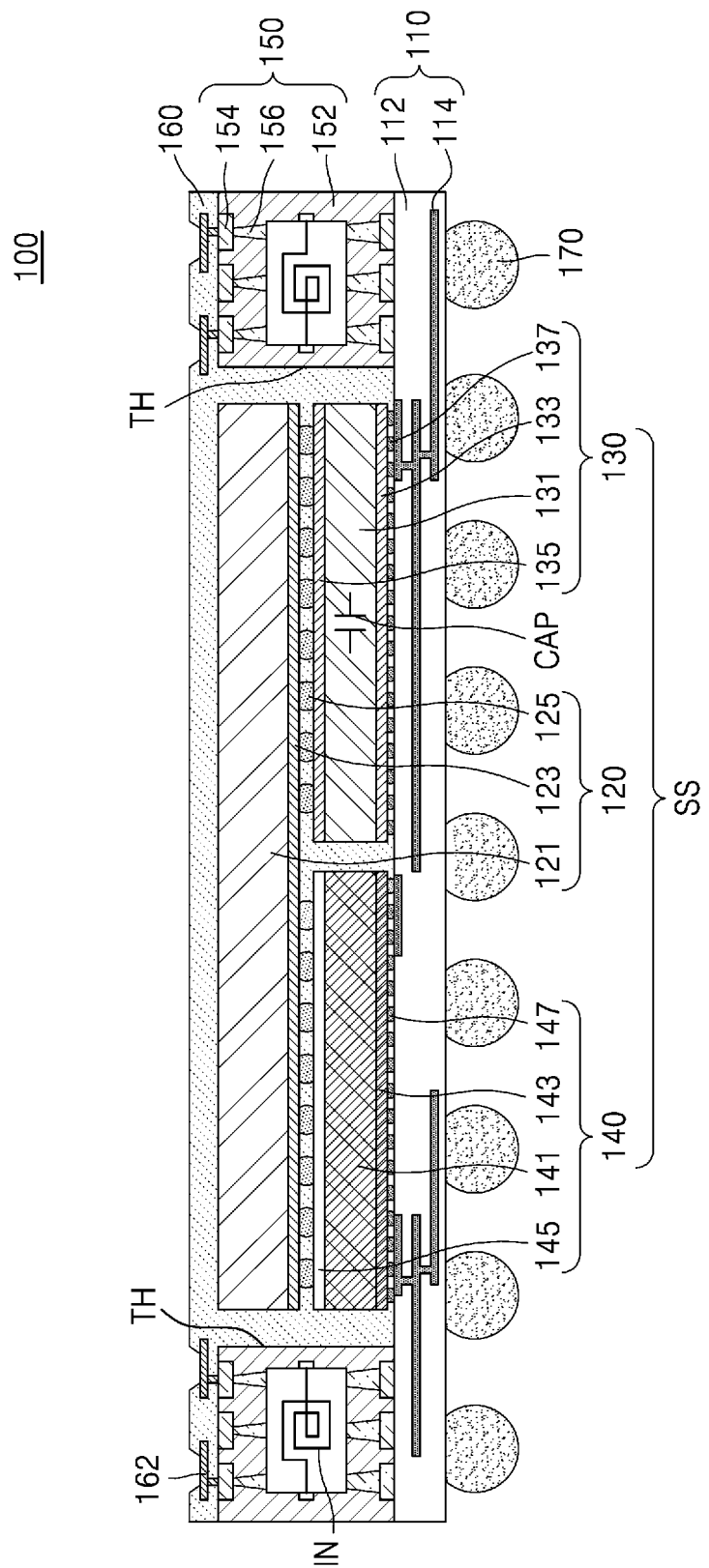
FIG. 1 is a cross-sectional view of an integrated voltage regulator (IVR) package including an inductor and a capacitor, according to an example embodiment of the inventive concept.
Figure 2:
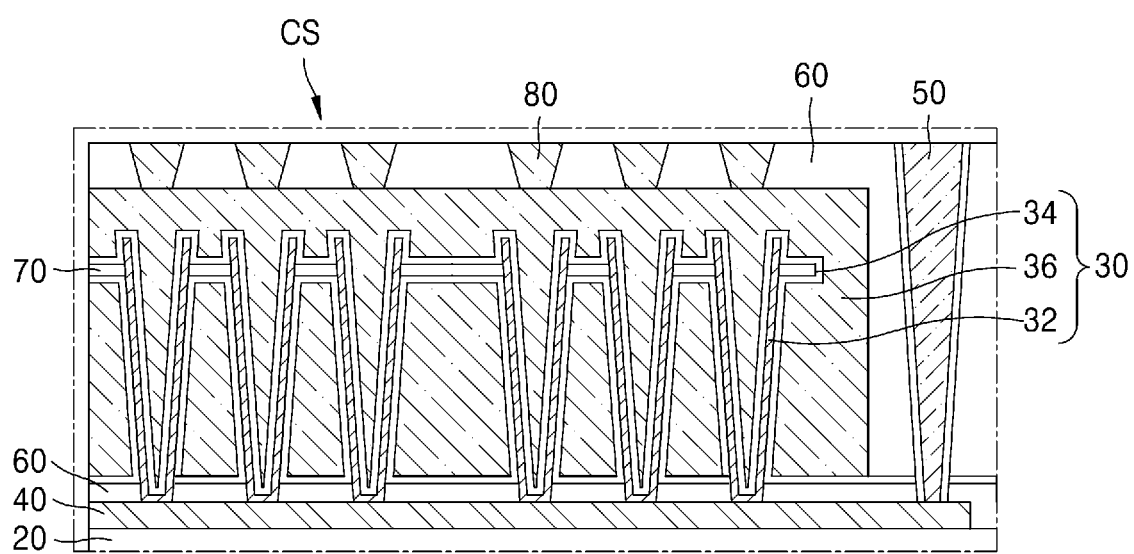
FIG. 2 is an enlarged cross-sectional view of a capacitor portion in a passive device chip in the IVR package of FIG. 1 according to example embodiments.
Figure 3A:
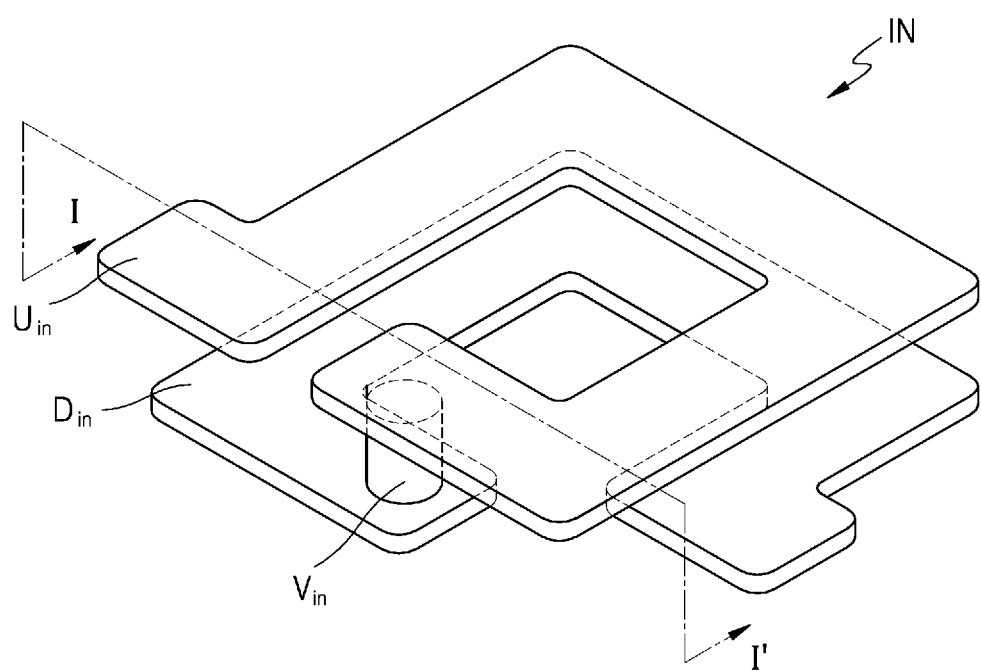
FIG. 3A is an enlarged perspective view of an inductor portion in the IVR package of FIG. 1 according to example embodiments.
Figure 3B:
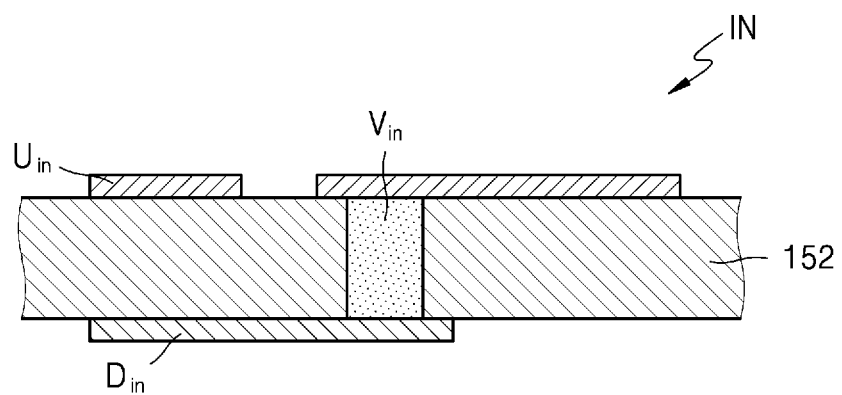
FIG. 3B is an enlarged cross-sectional view taken along a line I-I' of FIG. 3A according to example embodiments.

FIG. 1 is a cross-sectional view of an integrated voltage regulator (IVR) package including an inductor and a capacitor, according to an example embodiment of the inventive concept. FIG. 2 is an enlarged cross-sectional view of a capacitor portion in a passive device chip in the IVR package of FIG. 1 according to example embodiments. FIG. 3A is an enlarged perspective view of an inductor portion in the IVR package of FIG. 1, and FIG. 3B is an enlarged cross-sectional view taken along a line I-I' of FIG. 3A according to example embodiments.

Referring to FIG. 1, an IVR package 100 including an inductor and a capacitor (hereinafter, simply referred to as an 'IVR package' 100) according to the present embodiment may include a package substrate 110, a stacked structure SS, an intermediate substrate 150, a sealing material 160, and an external connection terminal 170.

The package substrate 110 may support the stacked structure SS and the intermediate substrate 150 arranged thereon. Also, the package substrate 110 may redistribute chip pads of the IVR chip 120 of the stacked structure SS by extending them to an external region. Therefore, the package substrate 110 may be referred to as a redistribution substrate. Also, according to some embodiments, the package substrate 110 may be referred to as a board or a board substrate.

In detail, the package substrate 110 may include a ceramic substrate, a printed circuit board (PCB), an organic substrate, an interposer substrate, etc. Also, according to some embodiments, the package substrate 110 may include an active wafer, such as a silicon wafer. In detail, the package substrate 110 may include a substrate body layer 112 and a wiring layer 114.

The substrate body layer 112 may include an insulation material, e.g., thermosetting resin such as epoxy resin, or thermoplastic resin such as polyimide, and may further include an inorganic filler. Also, the substrate body layer 112 may include prepreg, an Ajinomoto build-up film (ABF), FR-4, Bismaleimide Triazine (BT) resin, or photo imageable dielectric (PID) resin, and may further include an inorganic filler.

The wiring layer 114 may include redistribution lines and vias. A redistribution line may be formed having a multi-layered structure, and wiring lines of adjacent layers may be connected to each other through vias. The external connection terminal 170 may be disposed on the bottom surface of the substrate body layer 112. The external connection terminal 170 may be disposed on an external connection pad (not shown) and may be connected to the wiring layer 114 through the external connection pad. Also, the external connection terminal 170 may be connected to the stacked structure SS through the wiring layer 114.

As shown in FIG. 1, external connection terminals 170 may be arranged on the center region of the bottom surface of the substrate body layer 112 corresponding to the bottom surface of the stacked structure SS and the outer region of the bottom surface of the substrate body layer 112. As a result, the package substrate 110 may have a function of rearranging the external connection terminals 170 in a region larger than the bottom surface of the stacked structure SS, through the wiring layer 114. As such, a package structure in which the external connection terminals 170 are widely arranged in a region larger than the bottom surface of the stacked structure SS (e.g., the IVR chip 120) is referred to as a Fan-Out (FO) package structure.

The package substrate 110 may be formed at a panel level and may be included as a component of the IVR package 100 through individualization, such as sawing. Therefore, the IVR package 100 may be referred to as a FO-Panel Level Package (FO-PLP). According to some embodiments, the package substrate 110 may be formed at a wafer level and may be included as a component of the IVR package 100 through individualization, such as sawing. When the package substrate 110 is wafer-based, the IVR package 100 may be referred to as a FO-Wafer Level Package (FO-WLP).

The stacked structure SS may include the IVR chip 120, a passive device chip 130, and a lower chip 140. As shown in FIG. 1, the passive device chip 130 and the lower chip 140 may be arranged on the package substrate 110, and the IVR chip 120 may be disposed on the passive device chip 130 and the lower chip 140.

The IVR chip 120 may include a circuit for regulating a voltage therein, that is, a voltage regulator (VR). The VR may include a control circuit and a switching logic circuit. The control circuit may include a plurality of transistors for voltage regulation, and the switching logic circuit may include at least two transistors for selecting a current path. The switching logic circuit may be connected to a capacitor CAP disposed in the passive device chip 130 and an inductor IN disposed in the intermediate substrate 150. Herein, for convenience of description, the terms of a capacitor CAP and capacitors CAP may be used interchangeably, and the terms of an inductor IN and inductors IN may be used interchangeably. For example, the capacitor CAP may include one or more capacitors, and the inductor IN may include one or more inductors.

Here, the VR is generally a DC-DC converter and may be a type of increasing an input voltage or a type of decreasing an input voltage. Converters of both types change input voltages through switching operations. Here, noise generated by switching (e.g., voltage ripple noise) may be reduced by a capacitor. Generally, as the capacitance of a capacitor increases, the change in a current flowing through a converter circuit may decrease. Therefore, the noise reduction function may be improved by increasing a switching period.

In the IVR package 100 according to the present embodiment, the IVR chip 120 may be implemented as a semiconductor chip based on a silicon wafer. Also, the IVR chip 120 may be implemented having a structure in which a control circuit is integrated with a switching logic circuit in one semiconductor chip. The IVR chip 120 may be fabricated having a compact structure through a semiconductor process based on a silicon wafer.

In detail, the IVR chip 120 may include a first body layer 121, a wiring layer 123, and a first bump 125. The first body layer 121 may include a semiconductor substrate, an integrated circuit layer, and an interlayer insulation layer. Here, the semiconductor substrate may refer to a silicon substrate. Also, the integrated circuit layer may include a control circuit and a switching logic circuit, as described above. The wiring layer 123 may include an insulation layer and multi-layer wires in the insulation layer.

In the IVR package 100 of the present embodiment, the IVR chip 120 may further include logic devices, in addition to the VR. The logic devices may include, for example, logic circuits, such as, an AND, an OR, a NOT, and a flip-flop, and may perform various signal processing. For example, the logic devices may perform signal processing, such as analog signal processing, analog-to-digital conversion, and controlling. In general, logic devices may be included in one logic chip, and such a logic chip may be referred to as a control chip, a process chip, a central processing unit (CPU) chip, an application processor (AP) chip, an application specific integrated circuit (ASIC) chip, etc., according to functions thereof. Also, a logic chip may be implemented having a system on chip (SOC) structure by including logic devices having various functions. In the IVR package 100 of the present embodiment, the IVR chip 120 may include logic devices having various functions. Therefore, the IVR chip 120 may correspond to an (SOC+IVR) composite chip.

The passive device chip 130 is disposed on the package substrate 110 and may include one or more passive devices, e.g., one or more capacitors CAP, therein. The passive device chip 130 may be formed based on a silicon wafer. For example, the passive device chip 130 may have a structure in which one or more capacitors CAP are integrated in a semiconductor chip. For example, the passive device chip 130 may be an integrated stacked capacitor (ISC) chip. An ISC chip may include one or more large-capacity capacitors, e.g., capacitors from several nF to dozens of nF. For example, the ISC chip may include a stacked capacitor having conductive electrodes stacked in the second body layer 131 and the capacity of a capacitor may be increased by utilizing the surface area of the extended conductive electrodes. Therefore, in the IVR package 100 of the present embodiment, the passive device chip 130 including the capacitor CAP may greatly contribute to reduction of voltage ripple noise in a switching operation of a VR such that operating characteristics of the IVR chip 120 of the IVR package 100 may be improved and a total size of the IVR package 100 may be reduced.

The passive device chip 130 may include a second body layer 131, a lower passivation layer 133, an upper passivation layer 135, and a second bump 137. The capacitor CAP may be arranged in the second body layer 131. The capacitor CAP in the second body layer 131 are described later in more detail with reference to FIG. 2. The lower passivation layer 133 and the upper passivation layer 135 may be provided on the bottom surface and the top surface of the second body layer 131, respectively, to protect the capacitor CAP in the second body layer 131.

The lower chip 140 may be disposed on the package substrate 110 to be adjacent to the passive device chip 130. Together with the passive device chip 130, the lower chip 140 may support the IVR chip 120. The lower chip 140 may include a third body layer 141, a lower passivation layer 143, an upper passivation layer 145, and a third bump 147. Various devices may or may not be arranged in the third body layer 141 according to the function of the lower chip 140. The lower passivation layer 143 and the upper passivation layer 145 may be arranged on the bottom surface and the top surface of the second body layer 141, respectively, to protect devices of the third body layer 141.

The lower chip 140 may perform various functions. For example, the lower chip 140 may be a dummy chip for simply supporting the IVR chip 120. In such a case, the lower chip 140 may not include a circuit or a device in the third body layer 141. Therefore, in some embodiments, the dummy chip is only a "dummy" chip with respect to its lack of active or passive devices, and it may be alternatively referred to as a support chip, and the various components, such as "dummy third body layer 141," "dummy lower passivation layer 143," "dummy upper passivation layer 145," and "dummy third bump 147," etc., may be referred to herein as support chip components. Also, according to some embodiments, the lower chip 140 may function as a signal path and also support the IVR chip 120. In such a case, a plurality of through electrodes may be included in the third body layer 141.

Alternatively, the lower chip 140 may be a memory chip or a logic chip. As used herein, the memory chip and the logic chip may be formed and cut from a wafer (e.g., a silicon wafer). When the lower chip 140 is a memory chip, one or more memory chips may be arranged in the third body layer 141. For example, the memory chip may be a volatile memory such as a dynamic random access memory (DRAM) or a static random access memory (SRAM), or may be a nonvolatile memory such as a phase-change random access memory (PRAM), a magnetoresistive random access memory (MRAM), a ferroelectric random access memory (FeRAM) or a resistive random access memory (RRAM). The memory chip may also be a high bandwidth memory (HBM) chip in which a plurality of DRAM chips are stacked. Also, when the lower chip 140 is a logic chip, one or more logic devices may be arranged in the third body layer 141. For example, the logic chip may be a central processor unit (CPU), a micro processor unit (MPU), a graphics processor unit (GPU), a controller, or an application specific integrated circuit (ASIC), a modem chip, or the like. Alternatively, the logic chip may be an application processor (AP) used in a mobile phone or a smartphone. Furthermore, the lower chip 140 may be a passive device chip. When the lower chip 140 is a passive device chip, one or more passive devices, such as one or more inductors or one or more capacitors, may be arranged in the third body layer 141.

The intermediate substrate 150 may be disposed on the package substrate 110 and may have a structure surrounding the stacked structure SS. In a plan view, the intermediate substrate 150 may surround the stacked structure SS having a shape of a square or a rectangle. For example, the intermediate substrate 150 may be implemented as a single substrate surrounding the stacked structure SS or a plurality of substrates spaced from each other and surrounding the stacked structure SS. The intermediate substrate 150 may include a through hole TH passing through the intermediate substrate 150 from the top surface to the bottom surface of the intermediate substrate 150. According to some embodiments, the through hole TH may not completely penetrate through the intermediate substrate 150 and may have a cavity-like shape. The through hole TH may be located at the center portion of the intermediate substrate 150, as shown in FIG. 1. However, the location of the through hole TH is not limited to the center portion of the intermediate substrate 150. The stacked structure SS may be disposed in the through hole TH. For example, the intermediate substrate 150 may be implemented in a space at two edges of the package substrate 110 in a first direction X adjacent to the stacked structure SS (See FIG. 4C). Although not shown, the intermediate substrate 150 may be implemented in a space at four edges of the package substrate 110 in the first direction X and a second direction Y perpendicular to the first direction X adjacent to the stacked structure SS. Accordingly, an inductance of the inductor IN can increase without increasing an area of the inductor IN and sizes of the package substrate 110 and the IVR package 100 may be minimized.

The intermediate substrate 150 may include a body insulation layer 152, intermediate wires 154, and vias 156. The body insulation layer 152 may include an insulation material, e.g., thermosetting resin, such as epoxy resin, or thermoplastic resin, such as polyimide, and may further include an inorganic filler. Also, the body insulation layer 152 may include prepreg, an Ajinomoto Build-Up Film (ABF), FR-4, and Bismaleimide Triazine (BT) resin, and may further include an inorganic filler.

The intermediate wire 154 may be formed having a multi-layered structure, and multiple layers thereof may be electrically connected to one another through the via 156. FIG. 1 shows that the intermediate wire 154 is formed having a three-layer structure, but the number of layers of the intermediate wire 154 is not limited to three. Moreover, the body insulation layer 152 may have a multi-layered structure in correspondence to the multi-layered structure of the intermediate wiring 154. However, for convenience of explanation, the body insulation layer 152 is shown as a single layer in FIG. 1.

In the IVR package 100 of the present embodiment, the intermediate substrate 150 may be, for example, an embedded trace substrate (ETS). The ETS is a type of a coreless substrate, wherein, by using prepreg, instead of a core, the number of wiring layers may be reduced, and the cost of a substrate may be significantly reduced. Also, in the IVR package 100 of the present embodiment, the intermediate substrate 150 may include the inductor IN therein. The structure of the inductor IN in the intermediate substrate 150 is described later in more detail with reference to FIGS. 3A to 3B.

The sealing material 160 may seal the stacked structure SS to prevent the stacked structure SS from physical and chemical damage from the outside. The sealing material 160 may fill the space in the through hole TH of the intermediate substrate 150, extend onto the top surfaces of the stacked structure SS and the intermediate substrate 150, and cover the stacked structure SS and the intermediate substrate 150. Also, the sealing material 160 may fill the space between the stacked structure SS and the package substrate 110. The sealing material 160 may include an insulating material, e.g., thermosetting resin, such as epoxy resin, may include thermoplastic resin, such as polyimide, or may include an ABF, FR-4, BT resin, etc. However, the material of the sealing material 160 is not limited to the materials stated above.

In addition, an upper wiring layer 162 may be disposed in the sealing material 160. The upper wiring layer 162 may be disposed in the sealing material 160 at locations corresponding to the intermediate substrate 150. According to some embodiments, the upper wiring layer 162 may be disposed in the sealing material 160 at locations corresponding to the stacked structure SS. The upper wiring layer 162 may be electrically connected to the package substrate 110 and the stacked structure SS through the intermediate wires 154 and the vias 156 of the intermediate substrate 150.

The upper wiring layer 162 may include pads exposed from the sealing material 160. Inter-board connection terminals (refer to 240 of FIG. 13) may be arranged respectively on the pads of the upper wiring layer 162. According to some embodiments, the upper wiring layer 162 may be omitted. When the upper wiring layer 162 is omitted, portions of the intermediate wires 154 may constitute pads and may be exposed from the sealing material 160.

The IVR package 100 or an IVR system package (refer to 1000 of FIG. 13) may be mounted on an external system board or a main board via the external connection terminal 170. The external connection terminal 170 may include a conductive material, e.g., copper (Cu), aluminum (Al), silver (Ag), tin (Tin), gold (Au), solder, etc. However, the material constituting the external connection terminal 170 is not limited thereto. In the IVR package 100 of the present embodiment, the external connection terminal 170 may include, for example, a solder ball.

Referring to FIG. 2, a capacitor structure CS may include a capacitor 30. The capacitor 30 may include a lower electrode 32, an upper electrode 36, and a dielectric layer 34. Also, the capacitor structure CS may further include a plate electrode 40, a first through electrode 50, and a second through electrode 80. The capacitor structure CS may be disposed in the second body layer 131 of the passive device chip 130. The second body layer 131 may include a semiconductor substrate 20 and an insulation layer 60 on the semiconductor substrate 20. Due to the structure of the capacitor structure CS as described above, the capacitor 30 may have a large capacitance from several nF to dozens of nF.

The plate electrode 40 may include a metal, a metal oxide, a metal nitride, or polysilicon. The first through electrode 50 may penetrate through the insulation layer 60 and be connected to the plate electrode 40. The second through electrode 80 may penetrate through a portion of the insulation layer 60 on the upper electrode 36 and be connected to the upper electrode 36. In addition, supports 70 may be arranged between capacitors 30.

Referring to FIGS. 3A and 3B, the inductor IN may be disposed in the intermediate substrate 150, as described above. The inductor IN may include an upper wire Uin, a lower wire Din, and an inductor via Vin. The upper wire Uin and the lower wire Din may be parts of the intermediate wires 154 of the intermediate substrate 150. Also, the inductor via Vin may be a part of the via 156 of the intermediate substrate 150. In FIGS. 3A and 3B, the inductor IN is implemented using wires of two layers and one inductor via, but the structure of the inductor IN is not limited thereto. For example, the inductor IN may be implemented using wires of three or more layers and two or more inductor vias. In addition, the inductor IN may have a structure in which wires extend in one layer from the outside to the center in a spiral shape, and an inductor via is disposed at the center or at an outer end of the wires.

The IVR package 100 of the present embodiment may have a structure in which the inductor IN and the capacitor 30 are included in a package structure together. In detail, in the IVR package 100 of the present embodiment, the inductor IN may be implemented in the intermediate substrate 150, such as an ETS, and the capacitor 30 may be implemented in the passive device chip 130 (e.g., an ISC chip) disposed below the IVR chip 120. For example, one or more voltage regulators in the IVR chip 120 may be directly connected to the capacitor 30 in the passive device chip 130 through the first bumps 125 of the IVR chip 120 not using an additional intermediate layer such as the substrate body layer 112 and the wiring layer 114 of the package substrate 110. Therefore, the operating characteristics of the IVR chip 120 of the IVR package 100 of the present embodiment may be improved and the total size of the IVR package 100 may be minimized. For example, in the IVR package 100 of the present embodiment, the effect of voltage ripple noise reduction in a VR switching operation may be increased. Also, compared to a structure in which a capacitor is separately disposed on a board substrate, the IVR package 100 may contribute to significant reduction of the size of a board substrate.

For reference, a structure in which a power management integrated circuit (PMIC) on a board substrate is implemented in a package is referred to as an IVR. To implement the IVR, a design for increasing a switching frequency of a VR is needed, wherein it may be very important to arrange an inductor and a capacitor close to each other to reduce voltage ripple due to high-speed switching. In the IVR package 100 of the present embodiment, the inductor IN and the capacitor CAP are arranged together in a package to be adjacent to the IVR chip 120, and thus, the IVR package 100 may correspond to a package in which an IVR is implemented.

Also, the IVR package 100 of the present embodiment may correspond to a structure in which an inductor and a capacitor arranged on a main board of a mobile device are integrated together in a package. Therefore, the IVR package 100 of the present embodiment may contribute to improvement of power integrity (PI) characteristics and reduction of the area of the main board in the mobile device. Detailed descriptions thereof are given below with reference to FIGS. 4A to 4C.

Figure 4A:
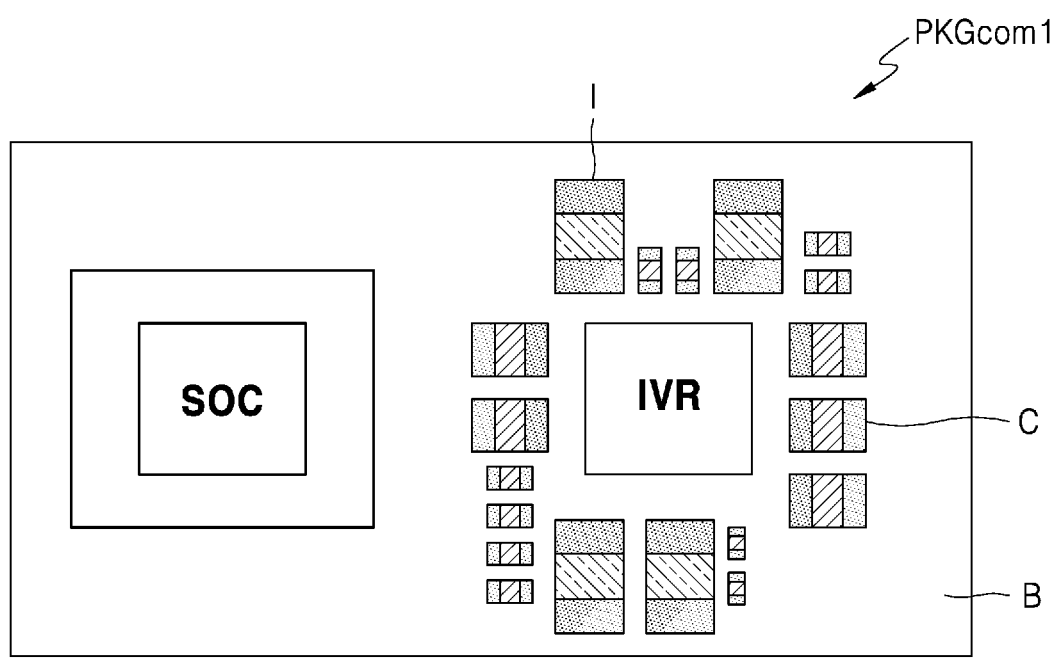
FIGS. 4A to 4C are plan views of package structures including IVR chips of comparative examples and the IVR package structure of FIG. 1 according to example embodiments.
Figure 4B:
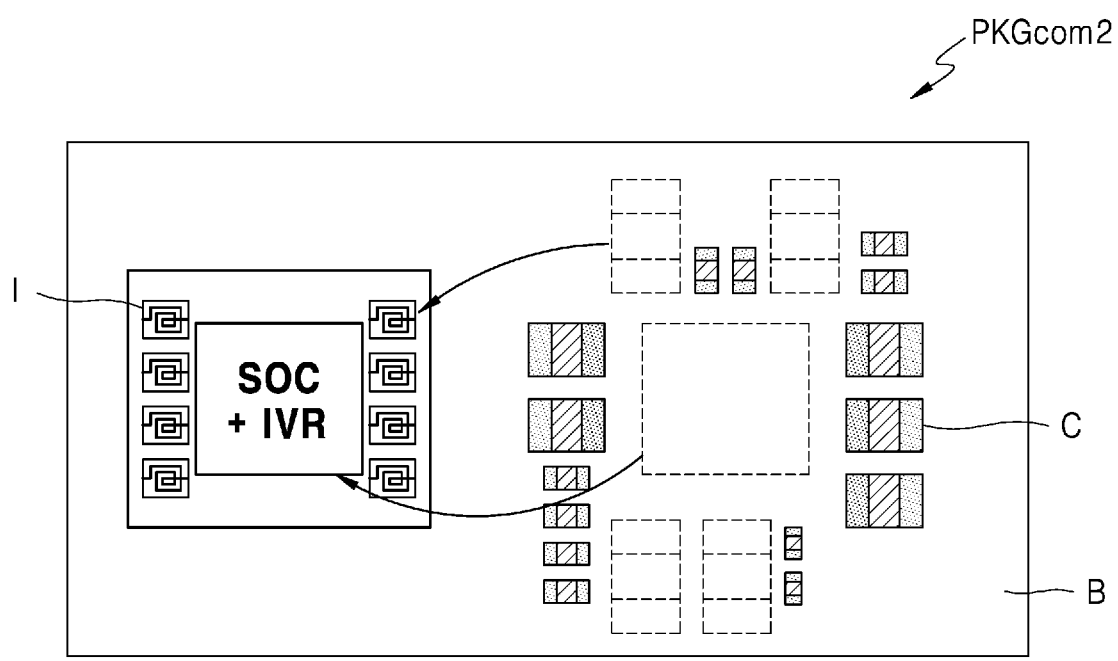
Figure 4C:
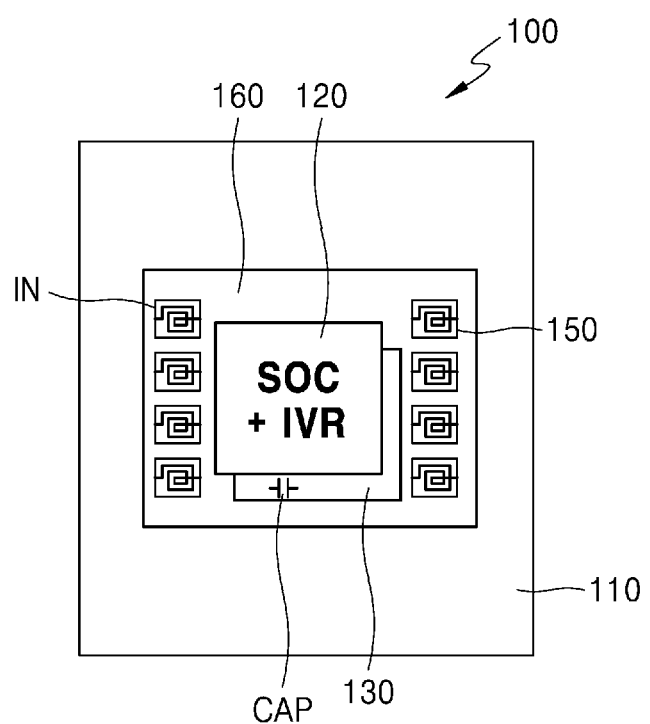

FIGS. 4A to 4C are plan views of package structures including IVR chips of comparative examples and the IVR package structure of FIG. 1. Descriptions already given above with reference to FIGS. 1, 2, 3A and 3B are briefly given or omitted.

Referring to FIG. 4A, a package PKGcom1 of a first comparative example may include a logic chip SOC, an individual IVR chip IVR, inductors I, and capacitors C on a board substrate B. In the package PKGcom1 of the first comparative example, the individual IVR chip IVR is disposed on the board substrate B separately from the logic chip SOC, and the inductors I and the capacitor C may be arranged around the individual IVR chip IVR. Therefore, the area of the board substrate B may be large. When the package PKGcom1 of the first comparative example is applied to a mobile device and the board substrate B corresponds to a main board, the size of the board substrate B is large, and thus, the area for a battery decreases. Also, in the package PKGcom1 of the first comparative example, the capacitors C have a small capacitance from about dozens of pF to hundreds of pF, and thus, the effect of noise reduction may not be significant.

Referring to FIG. 4B, a package PKGcom2 of a second comparative example may include a chip (SOC+IVR), (hereinafter referred to as a 'composite chip') in which a logic device and an IVR are integrated on the board substrate B together, the inductors I, and the capacitors C. In the case of the package PKGcom2 of the second comparative example, similar to the IVR package 100 of the present embodiment, the inductors I may be implemented by wires and vias of an ETS and may be arranged around the composite chip (SOC+IVR). Therefore, in the package PKGcom2 of the second comparative example, the area of the board substrate B may be reduced as much as the area occupied by the individual IVR chip IVR and the inductors I. However, even in the package PKGcom2 of the second comparative example, because the capacitors C are arranged on the board substrate B separately from the composite chip (SOC+IVR), the area occupied by the capacitors C in the area of the board substrate B needs to be secured. Also, because the capacitance of the capacitors C is still small, the effect of noise reduction in a switching operation may not be significant.

Referring to FIG. 4C, in the case of the IVR package 100 of the present embodiment, the IVR chip 120 may have a composite chip configuration in which a logic device and an IVR are integrated together. Also, an inductor IN may be formed by the intermediate wires 154 and the vias 156 in the intermediate substrate 150 corresponding to an ETS. Furthermore, a capacitor CAP may be implemented in the passive device chip 130 and may be arranged under the IVR chip 120. Therefore, in the structure of the IVR package 100 of the present embodiment, compared to the package PKGcom1 of the first comparative example, the area of a board substrate may be reduced as much as the area occupied by the individual IVR chip IVR, the inductors I, and the capacitors C. Also, compared to the package PKGcom2 of the second comparative example, the area of a board substrate may be reduced by the area occupied by the capacitors C. For example, the structure of the IVR package 100 of the present embodiment may reduce the area of a board substrate by about 30%, as compared to the package PKGcom2 of the second comparative example. In the IVR package 100 of the present embodiment, the passive device chip 130 is formed as an ISC chip, and thus, the passive device chip 130 may include a large-capacity capacitor in the form of a thin film. Therefore, the effect of noise reduction in a VR switching operation may be maximized.

Figure 5A:
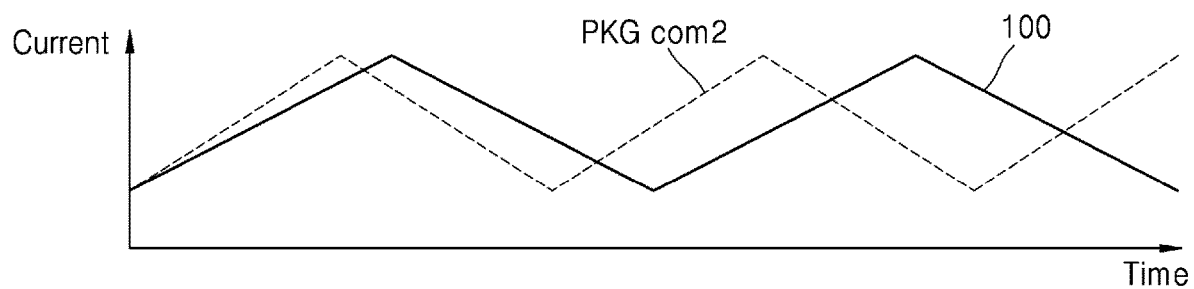
FIGS. 5A and 5B are graphs showing current and switching characteristics over time of the package of the comparative example of FIG. 4B and the IVR package of FIG. 1.
Figure 5B:
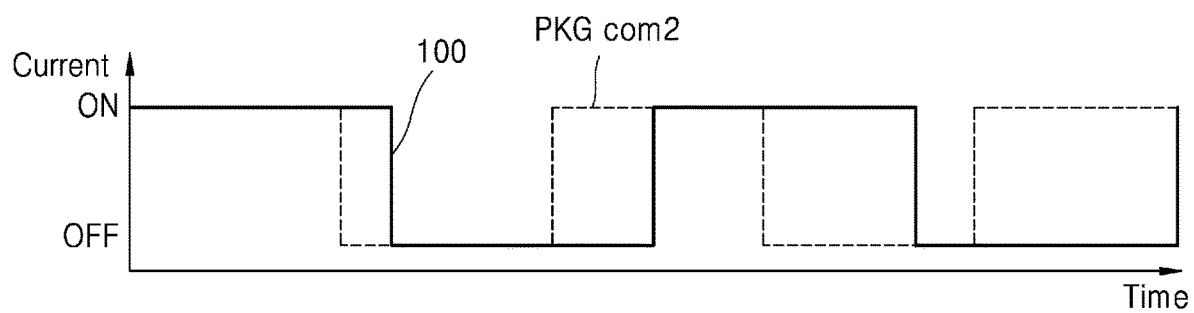

FIGS. 5A and 5B are graphs showing current and switching characteristics over time of the package of the second comparative example of FIG. 4B and the IVR package of FIG. 1, wherein a solid line corresponds to the IVR package of FIG. 1, and a dashed line corresponds to the package of the second comparative example of FIG. 4B. In FIG. 5A, the x-axis represents time and the y-axis represents current, wherein both of them are in arbitrary units. Also, in FIG. 5B, the x-axis represents time in an arbitrary unit, and the y-axis represents On/Off of a switch.

Referring to FIGS. 5A and 5B, it may be seen that up/down periods of a current increases in the IVR package 100 of the present embodiment, as compared to the package PKGcom2 of the second comparative example of FIG. 4B. The increase of the up/down period of a current corresponds to a decrease in the change in a current flowing in a converter circuit, thereby increasing on/off periods of a switching, as shown in FIG. 5B. As described above, an increase of the on/off period of a switching may increase the effect of noise reduction in a switching operation of a VR.

In the IVR package 100 of the present embodiment, the increase of the on/off period of the switching may be due to a structure in which a large-capacity capacitor is disposed adjacent to the IVR chip 120. For example, in the IVR package 100 of the present embodiment, the passive device chip 130 of the ISC chip may include one or more capacitors having a large capacity, e.g., from several nF to dozens of nF. Therefore, the on/off cycle of a switching increases as compared to the package PKGcom2 of the second comparative example including capacitors from dozens of pF to hundreds of pF, and thus, the effect of noise reduction in a switching operation of a VR may increase.

FIGS. 6 to 12 are cross-sectional views of IVR packages including inductors and capacitors according to example embodiments of the inventive concept. Descriptions already given above with reference to FIGS. 1, 2, 3A, 3B, 4A to 4C, 5A and 5B are briefly given or omitted.

Figure 6:
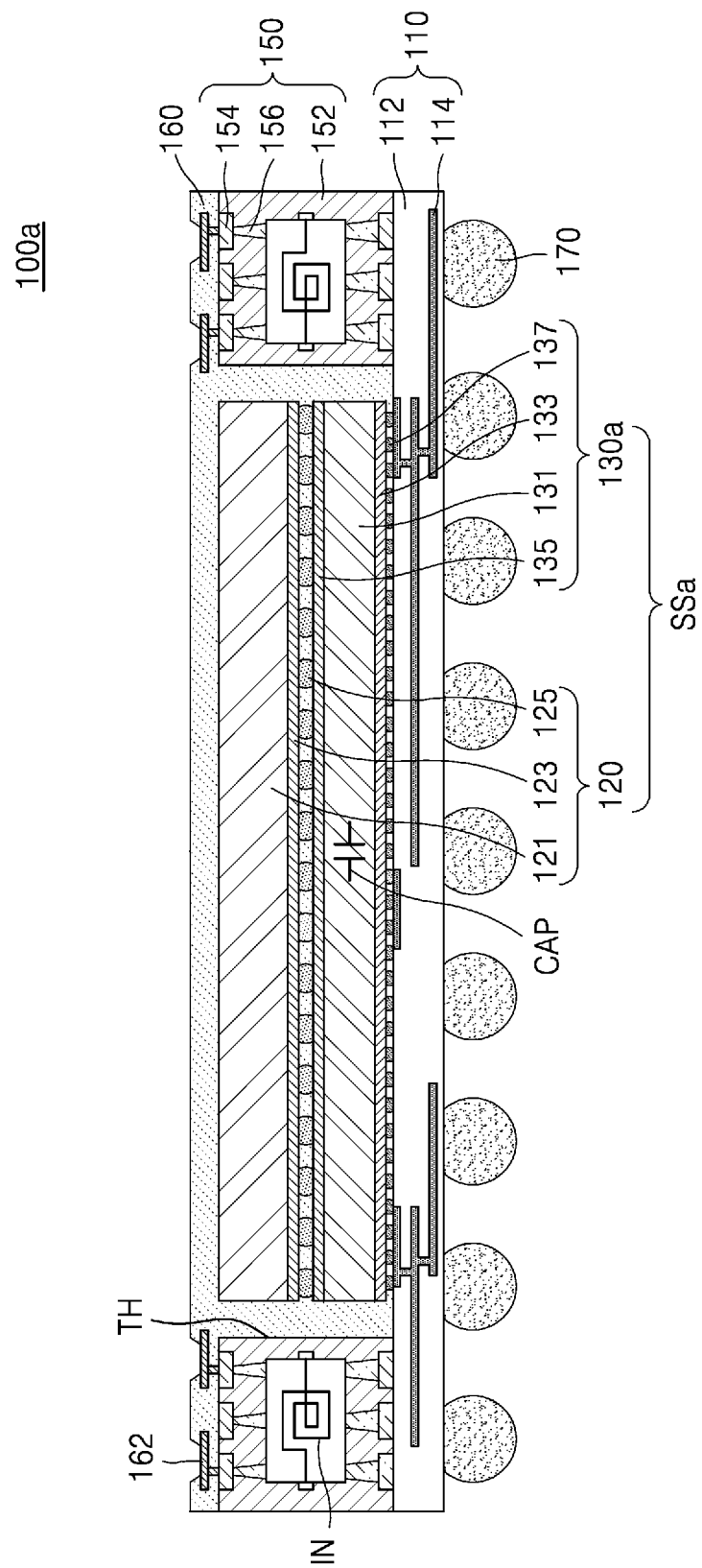
FIGS. 6 to 12 are cross-sectional views of IVR packages including one or more inductors and one or more capacitors according to example embodiments of the inventive concept.

Referring to FIG. 6, an IVR package 100a of the present embodiment may be different from the IVR package 100 of FIG. 1 in the structure of a stacked structure SSa. In detail, the IVR package 100a of the present embodiment may include the package substrate 110, the stacked structure SSa, the intermediate substrate 150, the sealing material 160, and the external connection terminal 170. The package substrate 110, the intermediate substrate 150, the sealing material 160, and the external connection terminal 170 are the same as those described above in the description of the IVR package 100 of FIG. 1.

The stacked structure SSa may include only the IVR chip 120 and a passive device chip 130a, and a lower chip may be omitted in the stacked structure SSa. The IVR chip 120 may include a VR and logic devices therein. The structure and the function of the IVR chip 120 are the same as those described for the IVR chip 120 of the IVR package 100 of FIG. 1. Also, the passive device chip 130a may be an ISC chip and may include the capacitor CAP therein. The passive device chip 130a and the capacitor CAP are the same as those described in the descriptions of FIGS. 1 and 2.

In the stacked structure SSa, the IVR chip 120 and the passive device chip 130a may have substantially the same size, and the IVR chip 120 may be disposed on the passive device chip 130a. In other words, in the IVR package 100 of FIG. 1, the passive device chip 130 is smaller than the IVR chip 120, and thus, the IVR chip 120 may be disposed over both the passive device chip 130 and the lower chip 140. However, in the IVR package 100a of the present embodiment, the passive device chip 130a has substantially the same size as the IVR chip 120 and the lower chip is omitted, and thus, the IVR chip 120 may be disposed only on the passive device chip 130a.

Also, in the IVR package 100a of the present embodiment, the inductor IN may be formed using the intermediate wires 154 and the vias 156 in the intermediate substrate 150 surrounding the stacked structure SSa. As a result, the IVR package 100a of the present embodiment may have a structure in which a logic device and a VR are integrated together in the IVR chip 120 and a structure in which the inductor IN and the capacitor CAP are arranged together in a package to be adjacent to the IVR chip 120. Therefore, the size of the IVR package 100a of the present embodiment may be minimized. Also, the passive device chip 130a may include one or more large-capacity capacitors based on an ISC chip, thereby maximizing the noise reduction effect in a switching operation of a VR.

Figure 7:
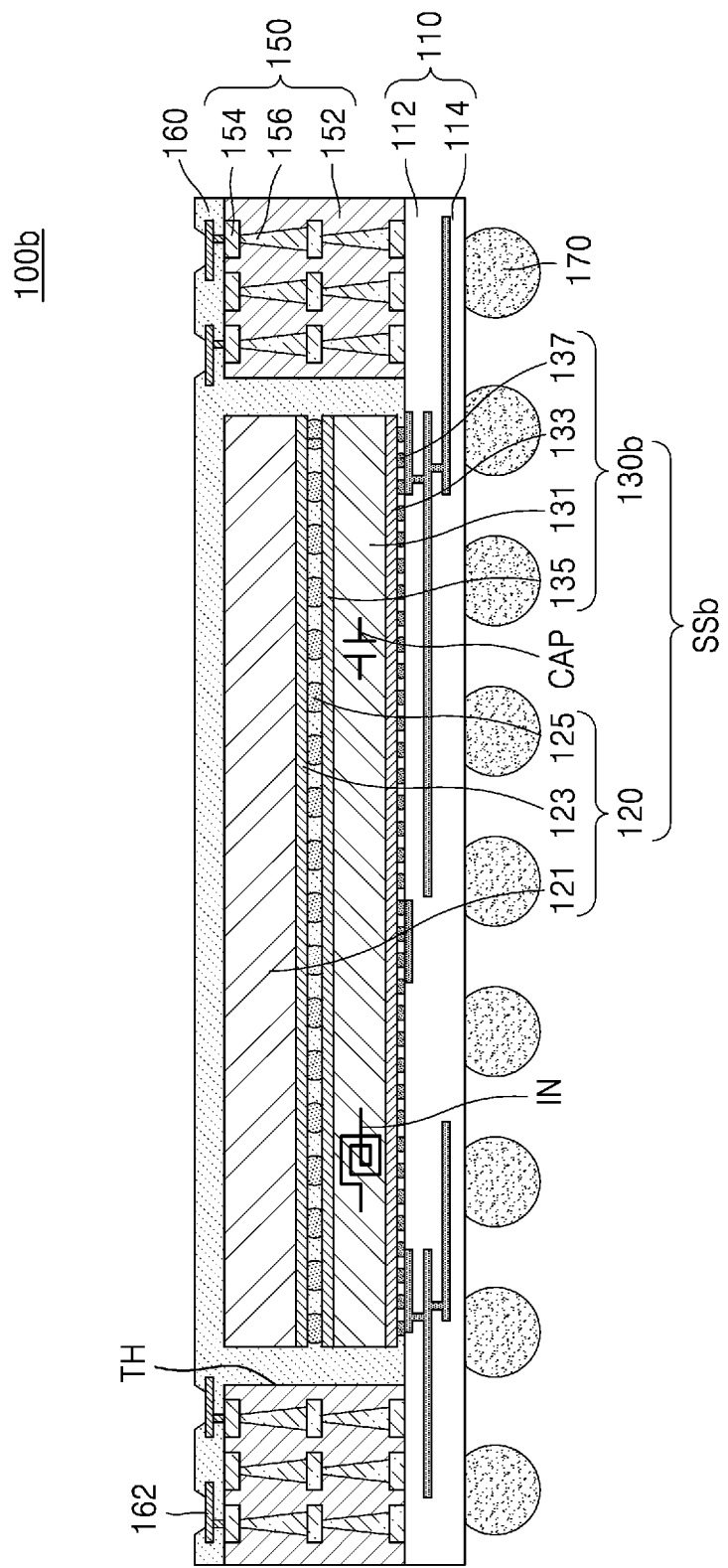

Referring to FIG. 7, an IVR package 100b of the present embodiment may be different from the IVR package 100 of FIG. 1 in the structure of a stacked structure SSb. In detail, the IVR package 100b of the present embodiment may include the package substrate 110, the stacked structure SSb, the intermediate substrate 150, the sealing material 160, and the external connection terminal 170. The package substrate 110, the intermediate substrate 150, the sealing material 160, and the external connection terminal 170 are the same as those described above in the description of the IVR package 100 of FIG. 1.

The stacked structure SSb may include only the IVR chip 120 and a passive device chip 130b, and a lower chip may be omitted in the stacked structure SSb. The IVR chip 120 may include a VR and logic devices therein. The structure and the function of the IVR chip 120 are the same as those described for the IVR chip 120 of the IVR package 100 of FIG. 1. Also, the passive device chip 130b may be an ISC chip and may include the capacitor CAP therein.

In the IVR package 100b of the present embodiment, a passive device chip 130b may further include an inductor IN therein. Because the inductor IN is integrated and disposed together with the capacitor CAP in the passive device chip 130b, an inductor in the intermediate substrate 150 may be omitted. However, according to some embodiments, an inductor may also be disposed in the intermediate substrate 150.

The IVR package 100b of the present embodiment may have a structure in which a logic device and a VR are integrated together in the IVR chip 120 and a structure in which the inductor IN and the capacitor CAP are arranged together in a package to be adjacent to the IVR chip 120. Therefore, the size of the IVR package 100b of the present embodiment may be minimized. Also, the passive device chip 130b may include a large-capacity capacitor based on an ISC chip, thereby maximizing the noise reduction effect in a switching operation of a VR.

Figure 8:
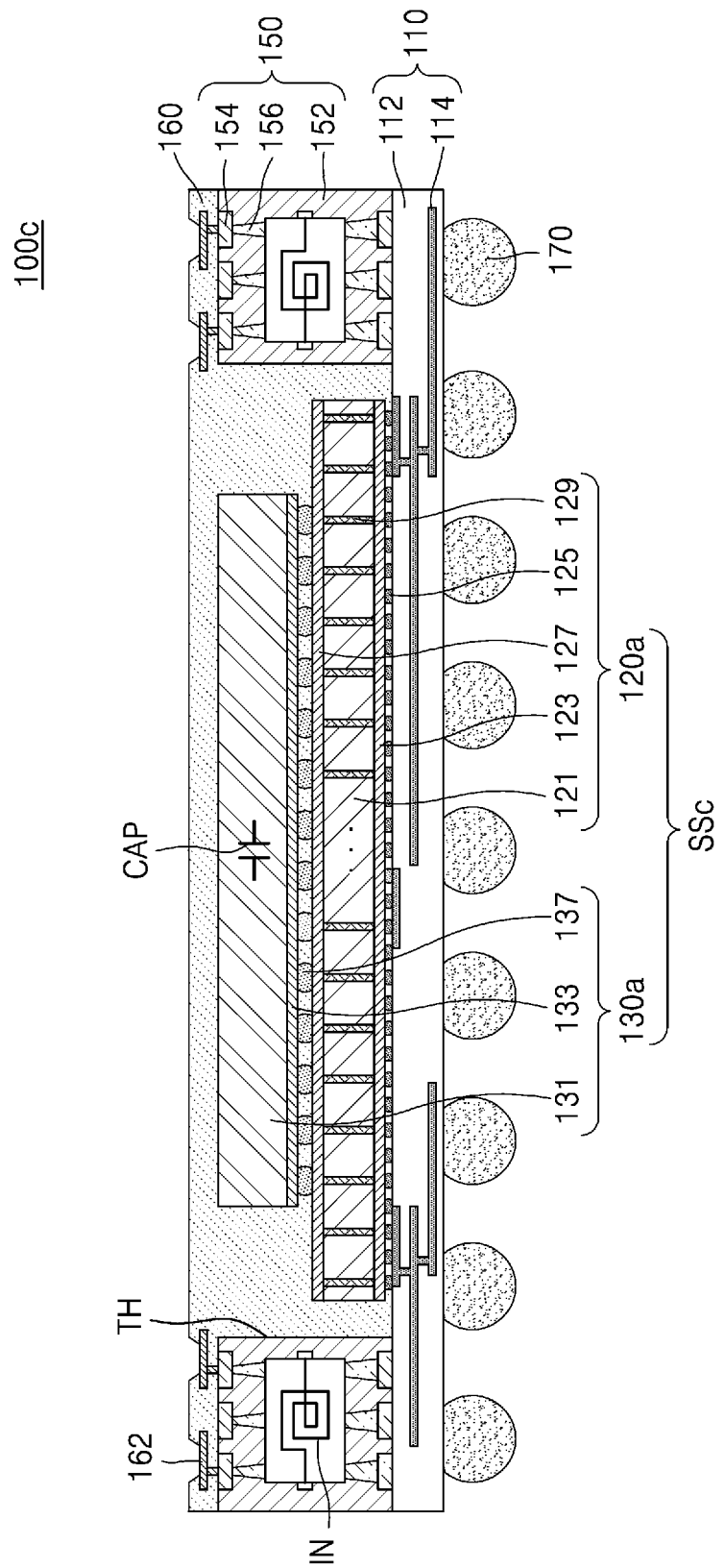

Referring to FIG. 8, an IVR package 100c of the present embodiment may be different from the IVR package 100 of FIG. 1 in the structure of a stacked structure SSc. In detail, the IVR package 100c of the present embodiment may include the package substrate 110, the stacked structure SSc, the intermediate substrate 150, the sealing material 160, and the external connection terminal 170. The package substrate 110, the intermediate substrate 150, the sealing material 160, and the external connection terminal 170 are the same as those described above in the description of the IVR package 100 of FIG. 1.

The stacked structure SSc may include only an IVR chip 120a and the passive device chip 130a, and a lower chip may be omitted in the stacked structure SSc. In the stacked structure SSc of the IVR package 100c of the present embodiment, the IVR chip 120a may be disposed in a lower portion, and the passive device chip 130a may be disposed in an upper portion. Based on such a stacked structure, the IVR chip 120a may further include through electrodes 129 therein. For example, the IVR chip 120a may include the first body layer 121, the wiring layer 123, first bumps 125, an upper passivation layer 127, and the through electrodes 129.

Logic devices and a VR may be arranged in the first body layer 121 of the IVR chip 120a. The through electrodes 129 may penetrate through the first body layer 121 and be connected to the wiring layer 123. According to some embodiments, the through electrodes 129 may also penetrate through the wiring layer 123. Because the through electrodes 129 penetrate the first body layer 121 including silicon, the through electrodes 129 may be referred to as through silicon vias (TSVs). A control circuit and a switching logic circuit of the IVR chip 120a may be connected to the capacitor CAP of the passive device chip 130a through the through electrodes 129 and/or the wiring layer 123.

The passive device chip 130a may be an ISC chip and may include the capacitor CAP therein. As shown in FIG. 8, in the stacked structure SSc, the passive device chip 130a may be smaller than the IVR chip 120a. However, according to some embodiments, the passive device chip 130a may have substantially the same size as the IVR chip 120a.

Also, in the IVR package 100c of the present embodiment, the inductor IN may be formed using the intermediate wires 154 and the vias 156 in the intermediate substrate 150 surrounding the stacked structure SSc. As a result, the IVR package 100c of the present embodiment may have a structure in which a logic device and a VR are integrated together in the IVR chip 120a and a structure in which the inductor IN and the capacitor CAP are arranged together in a package to be adjacent to the IVR chip 120a. Therefore, the size of the IVR package 100c of the present embodiment may be minimized. Also, the passive device chip 130a may include a large-capacity capacitor based on an ISC chip, thereby maximizing the noise reduction effect in a switching operation of a VR.

Figure 9:
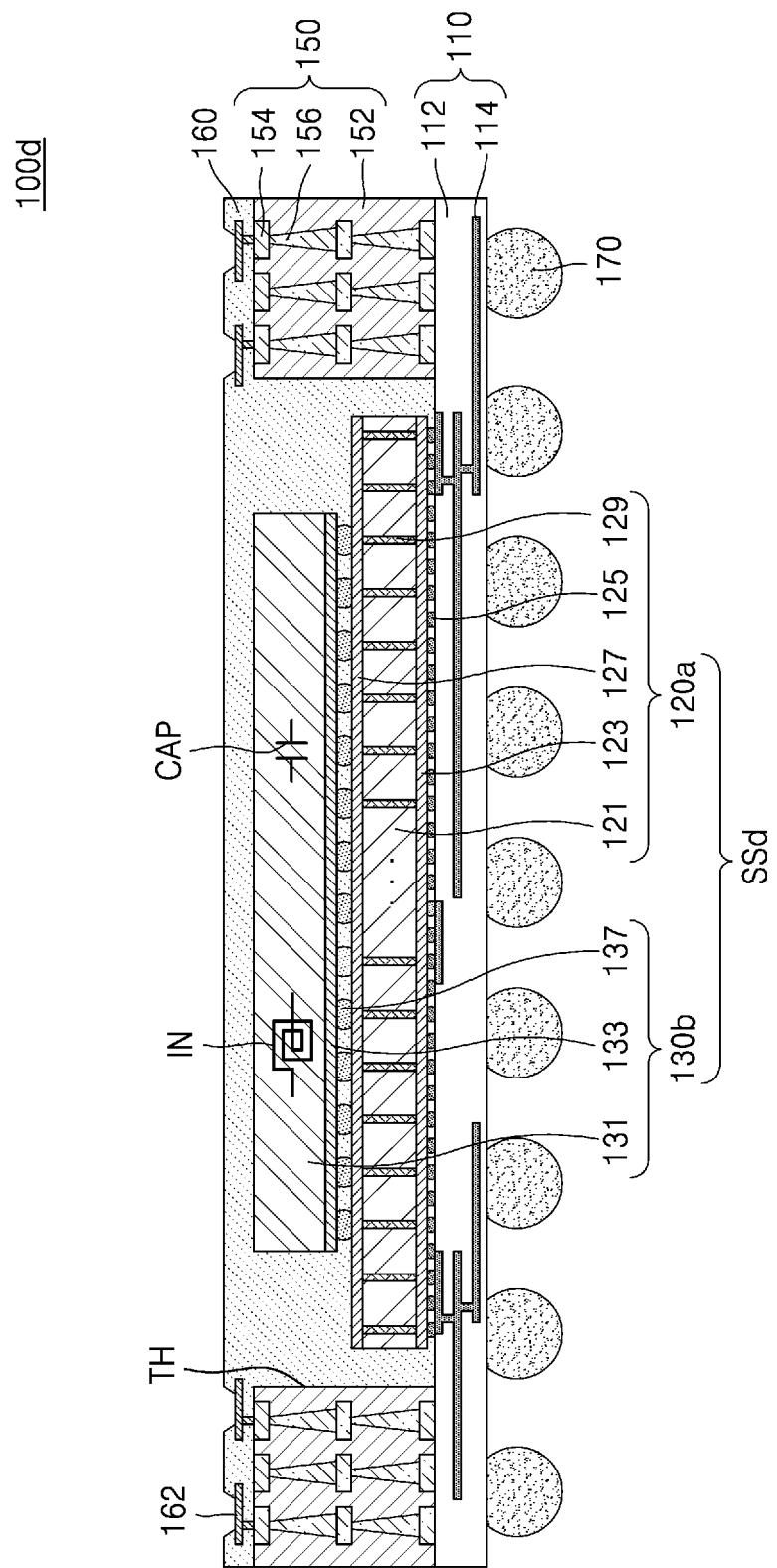

Referring to FIG. 9, an IVR package 100d of the present embodiment may be different from the IVR package 100c of FIG. 8 in the structure of a stacked structure SSd. In detail, the IVR package 100d of the present embodiment may include the package substrate 110, the stacked structure SSd, the intermediate substrate 150, the sealing material 160, and the external connection terminal 170. The package substrate 110, the intermediate substrate 150, the sealing material 160, and the external connection terminal 170 are the same as those described above in the description of the IVR package 100 of FIG. 1.

The stacked structure SSd may include only the IVR chip 120a and the passive device chip 130b, and a lower chip may be omitted in the stacked structure SSd. Also, in the stacked structure SSd of the IVR package 100d of the present embodiment, similar to the IVR package 100c of FIG. 8, the IVR chip 120a may be disposed in a lower portion, and the passive device chip 130b may be disposed in an upper portion. Therefore, the IVR chip 120a may further include the through electrodes 129 therein.

In the IVR package 100d of the present embodiment, the passive device chip 130b may further include the inductor IN therein. Because the inductor IN is integrated and disposed together with the capacitor CAP in the passive device chip 130b, an inductor in the intermediate substrate 150 may be omitted. However, according to some embodiments, an inductor may also be disposed in the intermediate substrate 150.

The IVR package 100d of the present embodiment may have a structure in which a logic device and a VR are integrated together in the IVR chip 120a and a structure in which the inductor IN and the capacitor CAP are arranged together in a package to be adjacent to the IVR chip 120a. Therefore, the size of the IVR package 100d of the present embodiment may be minimized. Also, the passive device chip 130b may include a large-capacity capacitor based on an ISC chip, thereby maximizing the noise reduction effect in a switching operation of a VR.

Figure 10:
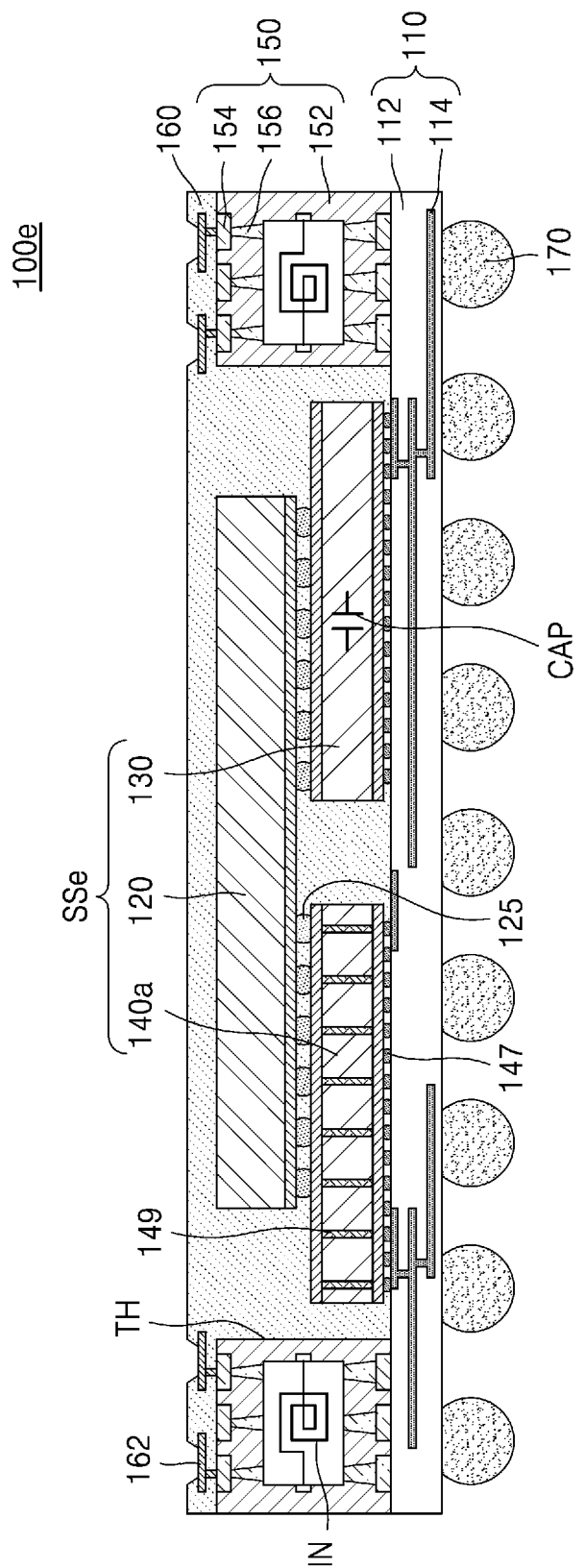

Referring to FIG. 10, an IVR package 100e of the present embodiment may be different from the IVR package 100 of FIG. 1 in the structure of a stacked structure SSe. In detail, the IVR package 100e of the present embodiment may include the package substrate 110, the stacked structure SSe, the intermediate substrate 150, the sealing material 160, and the external connection terminal 170. The package substrate 110, the intermediate substrate 150, the sealing material 160, and the external connection terminal 170 are the same as those described above in the description of the IVR package 100 of FIG. 1.

The stacked structure SSe may include the IVR chip 120, the passive device chip 130, and a lower chip 140a. The IVR chip 120 and the passive device chip 130 are the same as those described above with reference to FIGS. 1 and 2. The lower chip 140a may further include through electrodes 149 therein. The through electrode 149 may penetrate through the third body layer 141. The lower chip 140a may be a dummy chip, a memory chip, or a logic chip. When the lower chip 140a is a dummy chip, the through electrodes 149 may connect third bumps 147 to the first bumps 125 of the IVR chip 120. When the lower chip 140a is a memory chip or a logic chip, the lower chip 140a may include one or more memory chips or one or more logic devices and a wiring layer, and the through electrodes 149 may be connected to the wiring layer. Furthermore, the through electrodes 149 may be TSVs.

Also, in the IVR package 100e of the present embodiment, the inductor IN may be formed using the intermediate wires 154 and the vias 156 in the intermediate substrate 150 surrounding the stacked structure SSe. As a result, the IVR package 100e of the present embodiment may have a structure in which a logic device and a VR are integrated together in the IVR chip 120 and a structure in which the inductor IN and the capacitor CAP are arranged together in a package to be adjacent to the IVR chip 120. Therefore, the size of the IVR package 100e of the present embodiment may be minimized. Also, the passive device chip 130 may include a large-capacity capacitor based on an ISC chip, thereby maximizing the noise reduction effect in a switching operation of a VR.

Figure 11:
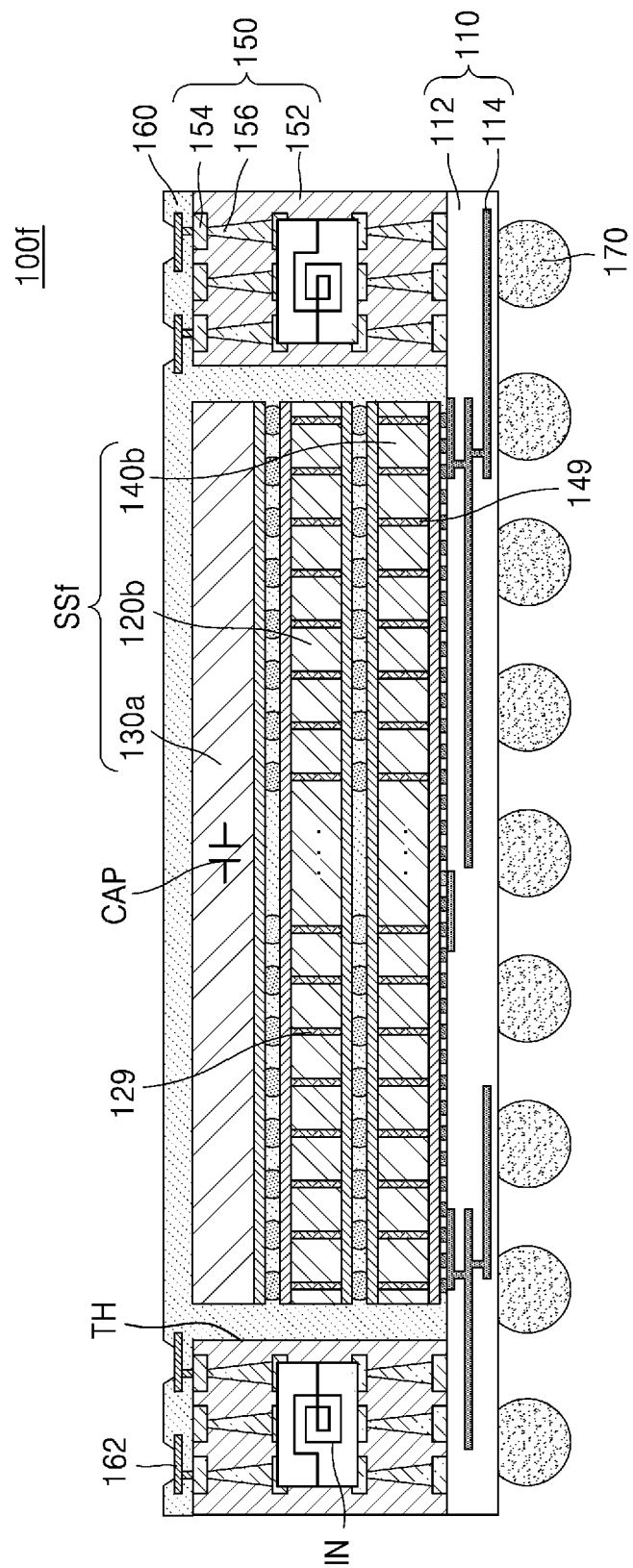

Referring to FIG. 11, an IVR package 100f of the present embodiment may be different from the IVR package 100 of FIG. 1 in the structure of a stacked structure SSf. In detail, the IVR package 100f of the present embodiment may include the package substrate 110, the stacked structure SSf, the intermediate substrate 150, the sealing material 160, and the external connection terminal 170. The package substrate 110, the intermediate substrate 150, the sealing material 160, and the external connection terminal 170 are the same as those described above in the description of the IVR package 100 of FIG. 1.

The stacked structure SSf may include an IVR chip 120b, the passive device chip 130a, and a lower chip 140b. In the IVR package 100f of the present embodiment, the stacked structure SSf may have a structure in which the lower chip 140b, the IVR chip 120b, and the passive device chip 130a are stacked in the order stated. However, according to some embodiments, the stacking order may be vary.

In the stacked structure SSf of the IVR package 100f of the present embodiment, the lower chip 140b may be a logic chip. Furthermore, the IVR chip 120b may include only a VR and may not include logic devices. However, according to some embodiments, the IVR chip 120b may include a VR and logic devices together. As shown in FIG. 11, the IVR chip 120b and the lower chip 140b may include through electrodes 129 and 149, respectively. Both of the through electrodes 129 and 149 may be TSVs.

As shown in FIG. 11, the IVR chip 120b, the passive device chip 130a, and the lower chip 140b may have substantially the same size. However, according to some embodiments, at least one of the IVR chip 120b, the passive device chip 130a, and the lower chip 140b may have a different size. When the lower chip 140b is smaller than the IVR chip 120b, to support the IVR chip 120b and the passive device chip 130a, a second lower chip may be additionally disposed under the IVR chip 120b.

Also, in the IVR package 100f of the present embodiment, the inductor IN may be formed using the intermediate wires 154 and the vias 156 in the intermediate substrate 150 surrounding the stacked structure SSf. As a result, the IVR package 100f of the present embodiment may have a structure in which the IVR chip 120b is stacked on the lower chip 140b and a structure in which the inductor IN and the capacitor CAP are arranged together in a package to be adjacent to the IVR chip 120b. Therefore, the size of the IVR package 100f of the present embodiment may be minimized. Also, the passive device chip 130a may include a large-capacity capacitor based on an ISC chip, thereby maximizing the noise reduction effect in a switching operation of a VR.

Figure 12:
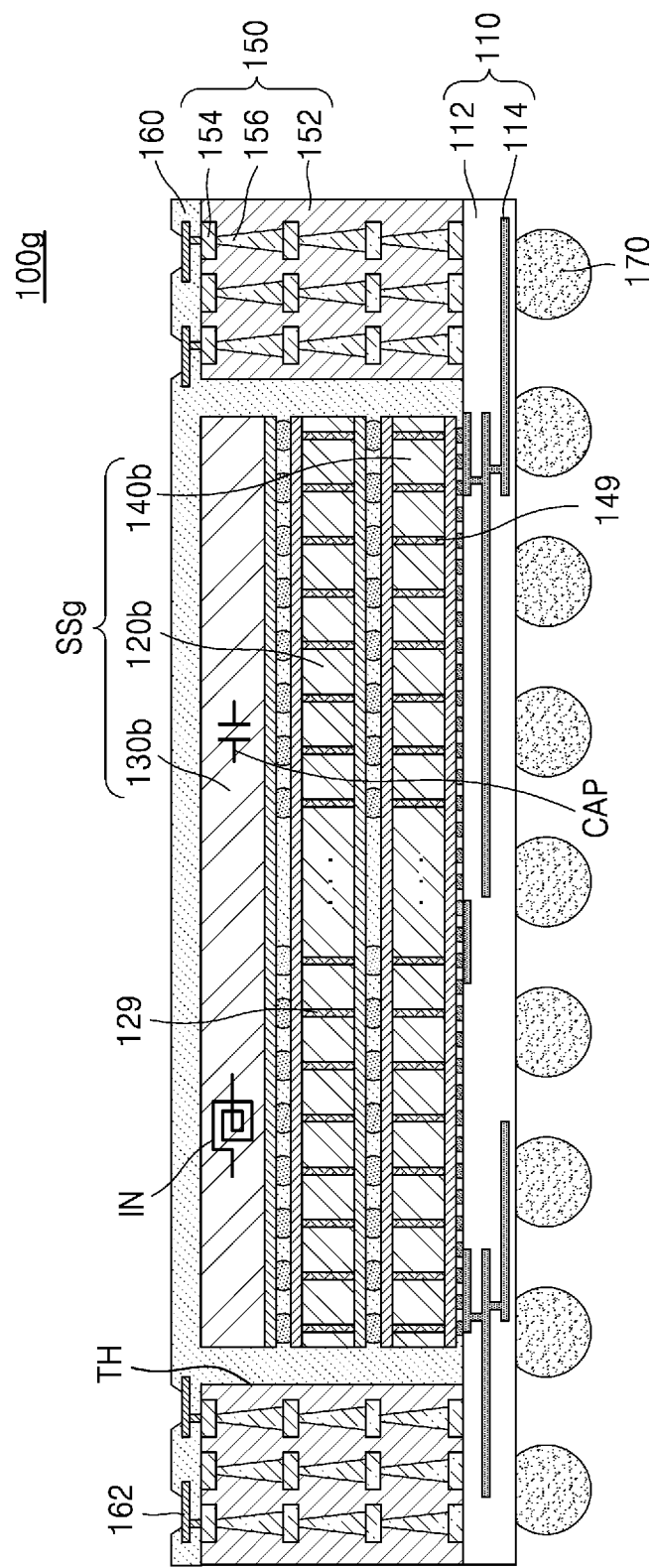

Referring to FIG. 12, an IVR package 100g of the present embodiment may be different from the IVR package 100f of FIG. 11 in the structure of a stacked structure SSg. In detail, the IVR package 100g of the present embodiment may include the package substrate 110, the stacked structure SSg, the intermediate substrate 150, the sealing material 160, and the external connection terminal 170. The package substrate 110, the intermediate substrate 150, the sealing material 160, and the external connection terminal 170 are the same as those described above in the description of the IVR package 100 of FIG. 1.

The stacked structure SSg may include the IVR chip 120b, the passive device chip 130b, and the lower chip 140b. Also, similar to the IVR package 100f of FIG. 11, the stacked structure SSg of the IVR package 100g of the present embodiment may have a structure in which the lower chip 140b, the IVR chip 120b, and the passive device chip 130b are stacked in the order stated. However, according to some embodiments, the stacking order may be vary.

In the IVR package 100g of the present embodiment, the passive device chip 130b may further include the inductor IN therein. Because the inductor IN is integrated and disposed together with the capacitor CAP in the passive device chip 130*b*, an inductor in the intermediate substrate 150 may be omitted. However, according to some embodiments, an inductor may also be disposed in the intermediate substrate 150.

The IVR package 100*g* of the present embodiment may have a structure in which the IVR chip 120*b* is stacked on the lower chip 140*b* and a structure in which the inductor IN and the capacitor CAP are arranged together in a package to be adjacent to the IVR chip 120*b*. Therefore, the size of the IVR package 100*g* of the present embodiment may be minimized. Also, the passive device chip 130*b* may include a large-capacity capacitor based on an ISC chip, thereby maximizing the noise reduction effect in a switching operation of a VR.

Figure 13:
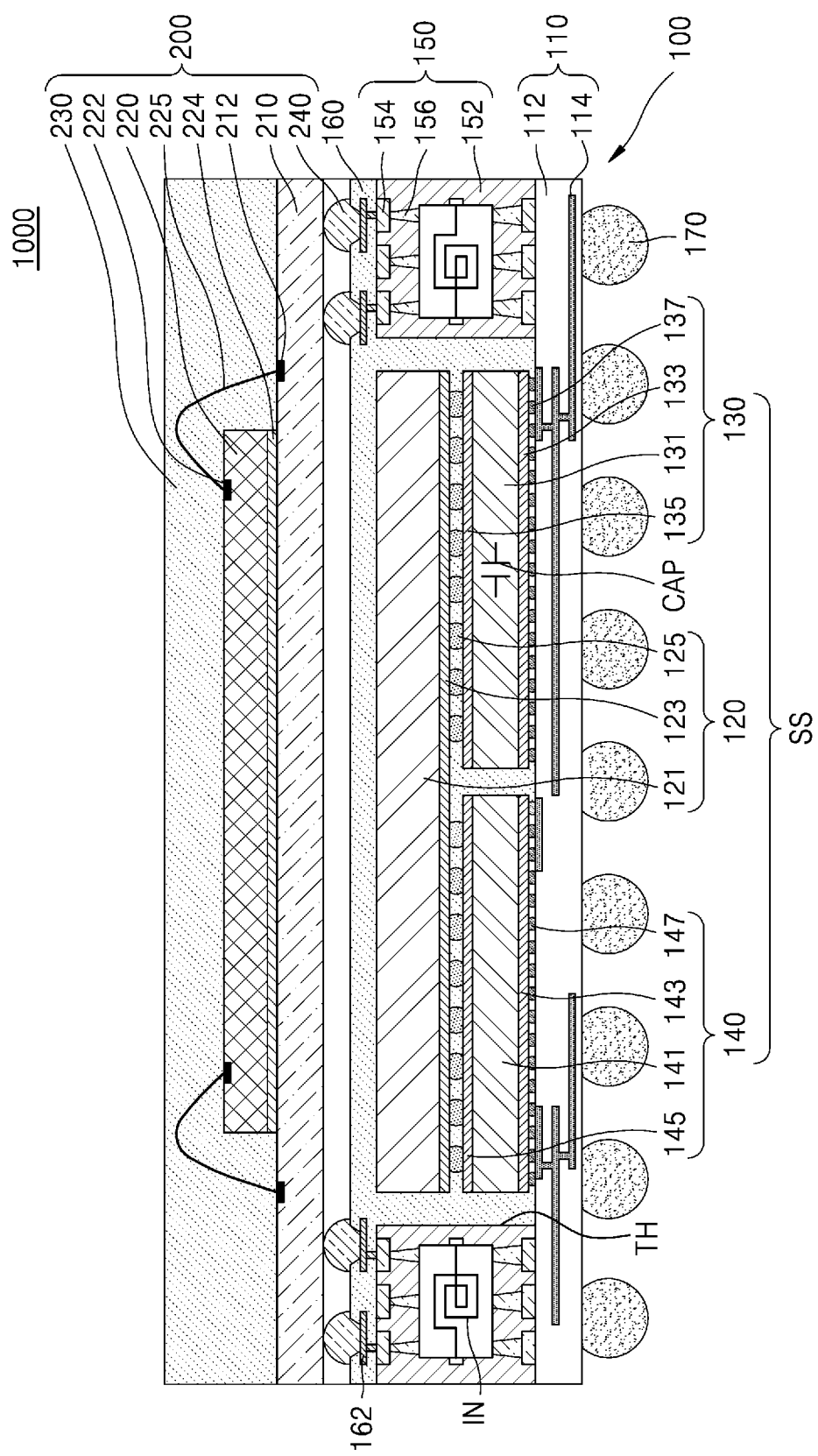
FIG. 13 is a cross-sectional view of an IVR system package including an IVR package according to an example embodiment of the inventive concept.

FIG. 13 is a cross-sectional view of an IVR system package including an IVR package according to an embodiment of the inventive concept. Descriptions already given above with reference to FIGS. 1, 2, 3A, 3B, 4A to 4C, 5A, 5B, and 6 to 12 are briefly given or omitted.

Referring to FIG. 13, an IVR system package 1000 including an IVR package of the present embodiment (hereinafter, simply referred to as an 'IVR system package' 1000) may include the IVR package 100 and a memory package 200.

The IVR package 100 of the IVR system package 1000 may include a lower package substrate 110, the stacked structure SS, the intermediate substrate 150, a first sealing material 160, and the external connection terminal 170. The IVR package 100 of the IVR system package 1000 may be the same as the IVR package 100 of FIG. 1. For example, the lower package substrate 110, the stacked structure SS, the intermediate substrate 150, the first sealing material 160, and the external connection terminal 170 are the same as the package substrate 110, the stacked structure SS, the intermediate substrate 150, the sealing material 160, and the external connection terminal 170 of the IVR package 100 of FIG. 1 described above. In the IVR system package 1000 of the present embodiment, the IVR package 100 includes the lower package substrate 110 and the first sealing material 160 to be distinguished from an upper package substrate 210 and a second sealing material 230 of the memory package 200 and may be substantially the same as the package substrate 110 and the sealing material 160 of the IVR package 100 of FIG. 1.

In the IVR system package 1000 of the present embodiment, the IVR package 100 is not limited to the IVR package 100 of FIG. 1. For example, the IVR system package 1000 of the present embodiment may include any one of the IVR packages 100*a* to 100*g* of FIGS. 6 to 12 instead of the IVR package 100 of FIG. 1. Furthermore, not limited to the structures of the IVR packages 100 and 100*a* to 100*g* of FIGS. 1 and 6 to 12, the IVR system package 1000 of the present embodiment may include IVR packages of various structures in which the inductor IN and the capacitor CAP are arranged in a package to be adjacent to an IVR chip and the capacitor CAP is implemented by an ISC chip.

The memory package 200 may include the upper package substrate 210, a memory chip 220, the second sealing material 230, and inter-board connection terminals 240.

The upper package substrate 210 is a support substrate on which the memory chip 220 is mounted and may include at least one layer of wires therein. When wires are formed in multiple layers, wires of different layers may be connected to each other through via contacts. According to some embodiments, the upper package substrate 210 may include through electrodes directly connecting pads on the top surface and the bottom surface to each other. However, since the upper package substrate 210 does not usually include a silicon wafer, the through electrodes may not correspond to TSVs.

Although not shown, passivation layers like solder resist may be formed on the top surface and the lower surface of the upper package substrate 210. Pads may be connected to wires of the wiring layer and may be exposed from the passivation layer. The upper package substrate 210 may include, for example, a ceramic substrate, a PCB, an organic substrate, an interposer substrate, etc. According to some embodiments, the upper package substrate 210 may include an active wafer, such as a silicon wafer.

As shown in FIG. 13, the inter-substrate connection terminals 240 like bumps or solder balls may be arranged on the bottom surface of the upper package substrate 210. The inter-board connection terminals 240 may mount the memory package 200 on the intermediate substrate 150. The inter-board connection terminals 240 may be smaller than the external connection terminals 170 and larger than bumps 125, 137, and 147. However, the size of the inter-board connection terminals 240 is not limited thereto. The material and the structure of the inter-board connection terminals 240 are the same as those described for the external connection terminals 170 above.

The memory chip 220 may be, for example, a volatile memory like a dynamic random access memory (DRAM) and a static random access memory (SRAM) or a non-volatile memory like a flash memory. The memory chip 220 may be mounted in a wire bonding structure on the upper package substrate 210 through an adhesive layer 224 and wires 225. For example, chip pads 222 of the memory chip 220 may be connected to substrate pads 212 of the upper package substrate 210 through the wires 225.

In the memory package 200 of the IVR system package 1000 of the present embodiment, the mounting structure of the memory chip 220 is not limited to the wire bonding structure. For example, the memory chip 220 may be mounted on the upper package substrate 210 in a flip-chip bonding structure. Meanwhile, although one memory chip 220 is mounted on the upper package substrate 210 in FIG. 13, two or more memory chips may be mounted on the upper package substrate 210 in a stacked structure. A structure in which a plurality of memory chips are mounted on the upper package substrate 210 is described later in more detail later with reference to FIGS. 14 and 15.

The second sealing material 230 may cover and seal the memory chip 220 on the upper package substrate 210. The second sealing material 230 may protect the memory chip 220 from physical and chemical damage from the outside by sealing the memory chip 220. The second sealing material 230 may include, for example, an epoxy-based material, a thermosetting material, a thermoplastic material, a UV curable material, etc. Also, the second sealing material 230 may include a resin and may further include an inorganic filler.

The IVR system package 1000 of the present embodiment may have a structure in which the memory package 200 is disposed on the IVR package 100 (i.e., a package on package (POP) structure in which a package is stacked on a package) and may include any one of the IVR packages 100 and 100*a* to 100*g* of FIGS. 1 and 6 to 12. Therefore, the overall size of the IVR system package 1000 of the present embodiment may be minimized. For example, when the IVR system package 1000 of the present embodiment is applied to a mobile device, the size of a main board may be reduced by up to 30%. Also, in the IVR system package 1000 of the present embodiment, a capacitor is implemented as a thin ISC chip and included in the IVR package 100, thereby maximizing the noise reduction effect in a switching operation of a VR.

Figure 14:
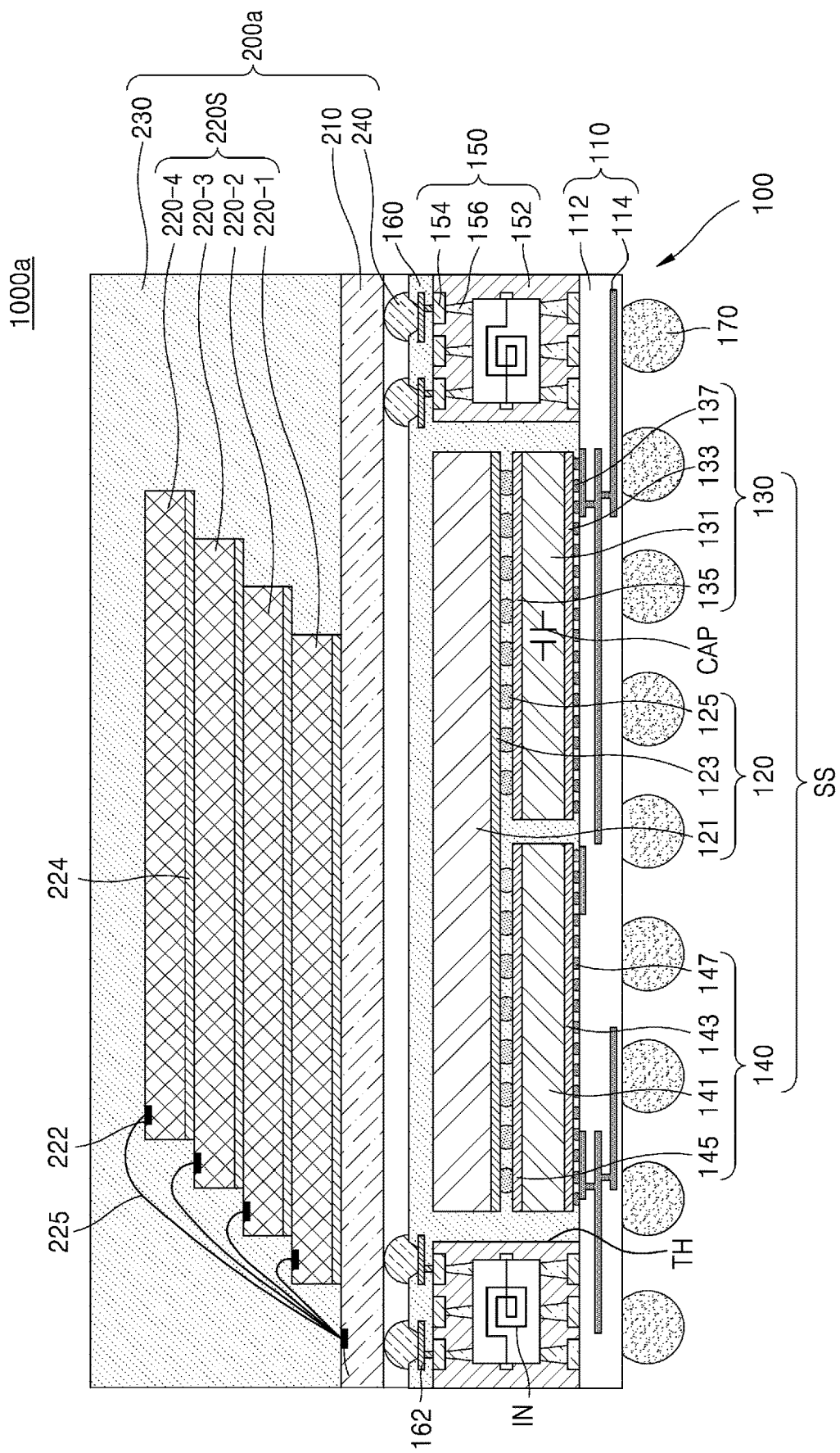
FIGS. 14 and 15 are cross-sectional views of IVR system packages including VR packages according to example embodiments of the inventive concept.
Figure 15:
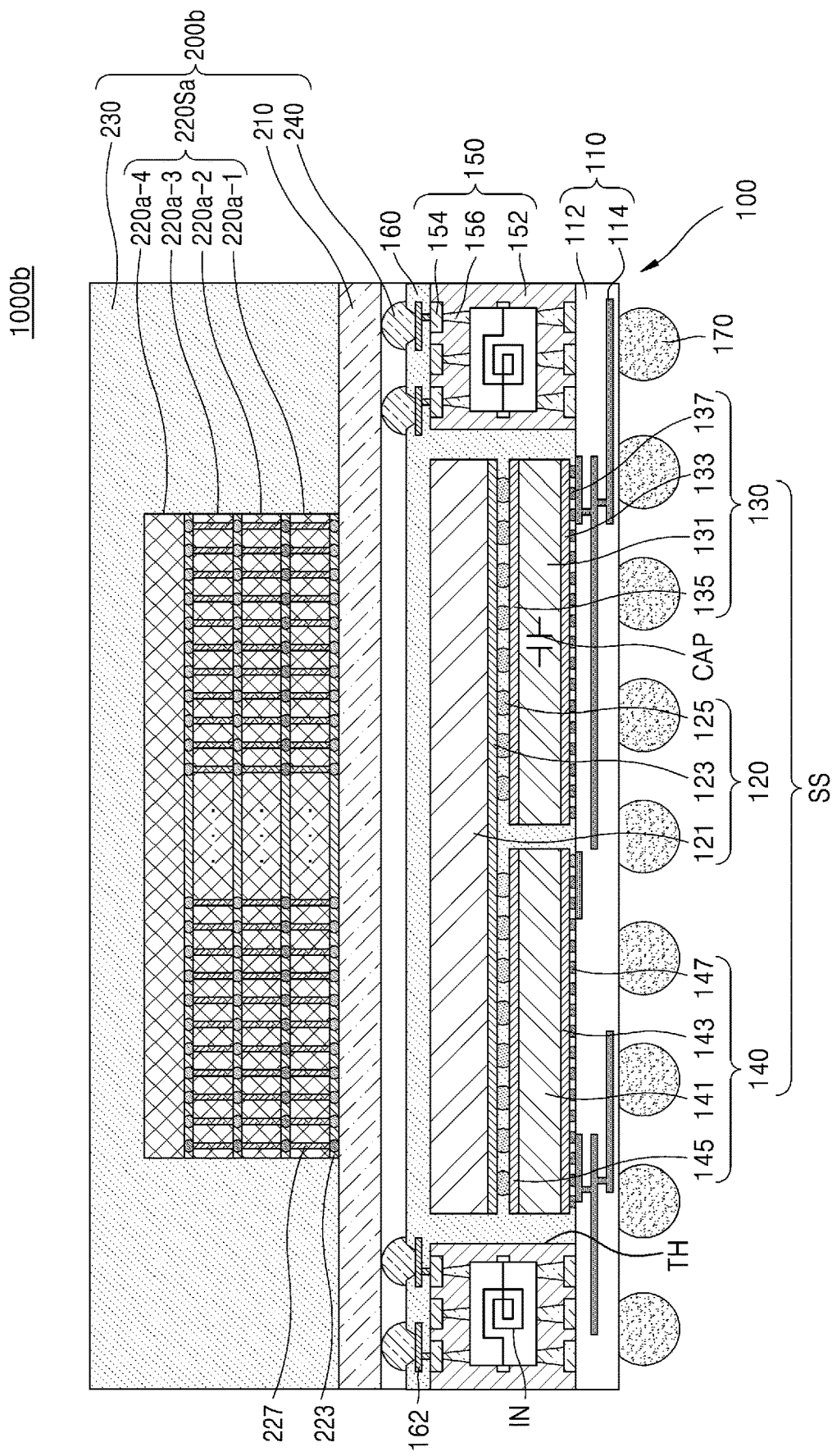

FIGS. 14 and 15 are cross-sectional views of IVR system packages including VR packages according to embodiments of the inventive concept. Descriptions already given above with reference to FIGS. 1, 2, 3A, 3B, 4A to 4C, 5A, 5B, and 6 to 13 are briefly given or omitted.

Referring to FIG. 14, an IVR system package 1000a of the present embodiment may be different from the IVR system package 1000 of FIG. 13 in the structure of a memory package 200a. In detail, the IVR system package 1000a of the present embodiment may include the IVR package 100 and the memory package 200a. The IVR package 100 is the same as the IVR package 100 of the IVR system package 1000 of FIG. 13.

Unlike as the IVR system package 1000 of FIG. 13, in the IVR system package 1000a of the present embodiment, the memory package 200a may include four memory chips 220-1 to 220-4. The four memory chips 220-1 to 220-4 may be connected to the upper package substrate 210 through the wires 225. In other words, the four memory chips 220-1 to 220-4 may be mounted on the upper package substrate 210 in a wire bonding structure.

The four memory chips 220-1 to 220-4 may constitute a memory stack 220S. The memory stack 220S may have a stepped stacking structure. However, in the IVR system package 1000a of the present embodiment, the structure of the memory stack 220S of the memory package 200a is not limited to a stepped stacking structure. The memory stack 220S may have any of various other stacking structures as long as the chip pads 222 of the four memory chips 220-1 to 220-4 are exposed. For example, the memory stack 220S may have a zigzag stacking structure. Meanwhile, in the IVR system package 1000a of the present embodiment, the memory package 200a includes the four memory chips 220-1 to 220-4, but the number of memory chips is not limited thereto. For example, the memory package 200a may include two, three, or five or more memory chips.

Referring to FIG. 15, an IVR system package 1000b of the present embodiment may be different from the IVR system package 1000 of FIG. 13 in the structure of a memory package 200b. In detail, the IVR system package 1000b of the present embodiment may include the IVR package 100 and the memory package 200b. The IVR package 100 is the same as the IVR package 100 of the IVR system package 1000 of FIG. 13.

Unlike as the IVR system package 1000 of FIG. 13, in the IVR system package 1000b of the present embodiment, the memory package 200b may include four memory chips 220a-1 to 220a-4. The four memory chips 220a-1 to 220a-4 may be connected to the upper package substrate 210 through bumps 223 and through electrodes 227. The through electrodes 227 may be TSVs. Meanwhile, the through electrodes 227 may not be formed in a fourth semiconductor chip 220a-4. Also, according to some embodiments, the second sealing material 230 may cover only side surfaces of the fourth semiconductor chip 220a-4. Therefore, the top surface of the fourth semiconductor chip 220a-4 may be exposed from the second sealing material 230.

The four memory chips 220a-1 to 220a-4 may constitute a memory stack 220Sa. For example, the four memory chips 220a-1 to 220a-4 may be stacked on the upper package substrate 210 and a memory chip therebelow through an adhesive layer and the bumps 223, thereby constituting the memory stack 220Sa. Meanwhile, in the IVR system package 1000b of the present embodiment, the memory package 200b includes the four memory chips 220a-1 to 220a-4, but the number of memory chips is not limited thereto. For example, the memory package 200b may include two, three, or five or more memory chips.

While the inventive concept has been particularly shown and described with reference to embodiments thereof, it will be understood that various changes in form and details may be made therein without departing from the spirit and scope of the following claims.

What is claimed is:

1. An integrated voltage regulator (IVR) package comprising:
    a package substrate;
    a stacked structure mounted on the package substrate and having a stack structure in which a passive device chip comprising one or more capacitors and an IVR chip including a voltage regulator are stacked; and
    an intermediate substrate disposed on the package substrate and having a structure surrounding the stacked structure, the intermediate substrate including vias therein,
    wherein one or more inductors are included in the intermediate substrate.

2. The IVR package of claim 1, wherein the stacked structure further includes a lower chip, and
    wherein the stacked structure has a structure in which the lower chip and the passive device chip are positioned at a lower portion of the stacked structure and the IVR chip is disposed on the lower chip and the passive device chip.

3. The IVR package of claim 2, wherein the one or more inductors are formed in the intermediate substrate by using the vias.

4. The IVR package of claim 2, wherein the IVR chip comprises logic devices, and
    wherein the lower chip comprises a logic chip, a memory chip, or a dummy chip.

5. The IVR package of claim 1, wherein the stacked structure has a structure in which the passive device chip is positioned at a lower portion of the stacked structure and the IVR chip is disposed on the passive device chip.

6. The IVR package of claim 5, wherein the one or more inductors are further formed in the passive device chip.

7. The IVR package of claim 1, wherein the stacked structure has a structure in which the IVR chip is positioned at a lower portion of the stacked structure and the passive device chip is disposed on the IVR chip, and
    wherein the IVR chip comprises through electrodes.

8. The IVR package of claim 1, wherein the package substrate is wafer-based or panel-based, and
    wherein the package substrate has a fan-out wafer level package (FOWLP) structure or a fan-out panel level package (FOPLP) structure according to a type of the package substrate.

9. An integrated voltage regulator (IVR) system package comprising:
    an IVR package; and
    a memory package including a memory chip and stacked on the IVR package,
    wherein the IVR package comprises:
    a lower package substrate;
    a stacked structure mounted on the lower package substrate and having a stack structure in which a passive device chip including one or more capacitors and an IVR chip including a voltage regulator are stacked; and an intermediate substrate disposed on the lower package substrate in a structure surrounding the stacked structure, and including vias therein, and wherein one or more inductors are included in the stacked structure or the intermediate substrate.

10. The IVR system package of claim 9, wherein the stacked structure further comprises a lower chip, wherein the stacked structure has a structure in which the lower chip and the passive device chip are positioned at a lower portion of the stacked structure and the IVR chip is disposed on the lower chip and the passive device chip, and wherein the one or more inductors are formed in the intermediate substrate by using the vias.

11. The IVR system package of claim 10, wherein the IVR chip includes logic circuits, and wherein the lower chip comprises a logic chip, a memory chip, or a dummy chip.

12. The IVR system package of claim 9, wherein the stacked structure has a structure in which the passive device chip is positioned at a lower portion of the stacked structure and the IVR chip is disposed on the passive device chip, and wherein the one or more inductors are formed in the intermediate substrate by using the vias or are formed in the passive device chip.

13. The IVR system package of claim 9, wherein the IVR package further comprises a first sealing material configured to fill a space between the stacked structure and the intermediate substrate and seal the stacked structure.

14. The IVR system package of claim 9, wherein the memory package comprises an upper package substrate, the memory chip mounted on the upper package substrate, and a second sealing material configured to seal the memory chip.

15. The IVR system package of claim 14, wherein the memory package further comprises a connection terminal on a bottom surface of the upper package substrate, and wherein the memory package is mounted on the intermediate substrate through the connection terminal.

16. The IVR system package of claim 9, wherein the lower package substrate is wafer-based or panel-based, and wherein the lower package substrate has a fan-out wafer level package (FOWLP) structure or a fan-out panel level package (FOPLP) structure according to a type of the lower package substrate.

17. A 3-dimensional (3D) package having a package on package (POP) structure, the 3D package comprising:

a lower package substrate;

a passive device chip mounted on the lower package substrate and comprising one or more capacitors;

a lower chip mounted on the lower package substrate and disposed adjacent to the passive device chip;

an integrated voltage regulator (IVR) chip disposed commonly over the passive device chip and the lower chip, and including a voltage regulator;

an intermediate substrate disposed on the lower package substrate in a structure surrounding the passive device chip, the lower chip, and the IVR chip, the intermediate substrate including vias therein;

an inner sealing material configured to fill a space between the passive device chip, the lower chip, and the IVR chip and the intermediate substrate and sealing the passive device chip, the lower chip, and the IVR chip; and a memory package mounted on the intermediate substrate, and including a memory chip, wherein one or more inductors are arranged in the intermediate substrate by using the vias.

18. The 3D package of claim 17, wherein the IVR chip includes logic circuits, wherein the passive device chip comprises an integrated stacked capacitor (ISC) chip, and wherein the lower chip comprises a logic chip, a memory chip, or a dummy chip.

19. The 3D package of claim 17, wherein the memory package comprises an upper package substrate, at least one memory chip mounted on the upper package substrate, and an upper sealing material configured to seal the at least one memory chip, and wherein the memory package is mounted on the intermediate substrate through a connection terminal on a bottom surface of the upper package substrate.

20. The 3D package of claim 17, wherein the lower package substrate is wafer-based or panel-based, and wherein the lower package substrate has a fan-out wafer level package (FOWLP) structure or a fan-out panel level package (FOPLP) structure according to a type of the lower package substrate.

* * * * *